US012720728B2

(12) United States Patent
Park et al.

(10) Patent No.: US 12,720,728 B2
(45) Date of Patent: Aug. 25, 2026

(54) SEMICONDUCTOR DEVICES INCLUDING CONDUCTIVE FILLING PATTERN

(71) Applicant: SAMSUNG ELECTRONICS CO., LTD., Suwon-si (KR)

(72) Inventors: Jingyu Park, Suwon-si (KR); Jongyoung Park, Suwon-si (KR); Taeyoung Koh, Suwon-si (KR); Kiyong Kim, Suwon-si (KR); Sundoo Kim, Suwon-si (KR); Jaehyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 311 days.

(21) Appl. No.: 18/233,061

(22) Filed: Aug. 11, 2023

(65) Prior Publication Data

US 2024/0090199 A1 Mar. 14, 2024

(30) Foreign Application Priority Data

Sep. 13, 2022 (KR) ........................ 10-2022-0114723

(51) Int. Cl.
*H10B 12/00* (2023.01)

(52) U.S. Cl.
CPC ........... *H10B 12/315* (2023.02); *H10B 12/34* (2023.02); *H10B 12/482* (2023.02)

(58) Field of Classification Search
CPC .... H10B 12/0335; H10B 12/05; H10B 12/30; H10B 12/315; H10B 12/34; H10B 12/36; H10B 12/482
See application file for complete search history.

(56) References Cited

U.S. PATENT DOCUMENTS

| | | | |
|---|---|---|---|
| 9,236,292 | B2 | 1/2016 | Romero et al. |
| 9,932,671 | B2 | 4/2018 | Blackwell et al. |
| 10,707,215 | B2 | 7/2020 | Simsek-Ege et al. |

(Continued)

FOREIGN PATENT DOCUMENTS

| | | | |
|---|---|---|---|
| JP | 2014-216327 | A | 11/2014 |
| KR | 10-2020-0140645 | A | 12/2020 |

(Continued)

OTHER PUBLICATIONS

Communication issued May 13, 2024 by the Taiwan Patent Office in Taiwan Patent Application No. 112131226.

(Continued)

*Primary Examiner* — Hoai V Pham
(74) *Attorney, Agent, or Firm* — Sughrue Mion, PLLC

(57) ABSTRACT

A semiconductor device includes a first active pattern on a substrate, the first active pattern extending in a third direction having an acute angle with respect to a first direction and a second direction, the first direction and the second direction being substantially parallel to an upper surface of the substrate and substantially perpendicular to each other, a first conductive filling pattern on an upper surface of a central portion of the first active pattern, the first conductive filling pattern having a shape of a parallelogram, a gate structure extending in the first direction in an upper portion of the first active pattern, and a bit line structure on the first conductive filling pattern and extending in the second direction.

20 Claims, 26 Drawing Sheets

(56) References Cited

U.S. PATENT DOCUMENTS

| | | | |
|---|---|---|---|
| 10,796,950 B2 | 10/2020 | Lee et al. | |
| 11,037,930 B2 | 6/2021 | Park et al. | |
| 11,289,375 B2 | 3/2022 | Park et al. | |
| 11,742,401 B2 | 8/2023 | Yoon et al. | |
| 2022/0115382 A1 | 4/2022 | Lee et al. | |
| 2022/0157822 A1 | 5/2022 | Ahn et al. | |
| 2023/0225117 A1* | 7/2023 | Hong | H10B 12/09 257/296 |

FOREIGN PATENT DOCUMENTS

| | | |
|---|---|---|
| TW | 202221893 A | 6/2022 |
| TW | 202224188 A | 6/2022 |

OTHER PUBLICATIONS

Communication issued Jan. 26, 2026 by the Korean Ministry of Intellectual Property in Korean Patent Application No. 10-2022-0114723.

* cited by examiner

SEMICONDUCTOR DEVICES INCLUDING CONDUCTIVE FILLING PATTERN

CROSS-REFERENCE TO RELATED APPLICATION

This application is based on and claims priority to Korean Patent Application No. 10-2022-0114723, filed on Sep. 13, 2022 in the Korean Intellectual Property Office, the disclosure of which is incorporated herein by reference in its entirety.

BACKGROUND

1. Field

Example embodiments of the present disclosure relate to a semiconductor device. More particularly, example embodiments of the present disclosure relate to a dynamic random access memory (DRAM) device.

2. Description of Related Art

In a method of manufacturing a dynamic random access memory (DRAM) device, an opening may be formed to expose an upper surface of an active pattern, a layer structure may be formed to fill the opening, and the layer structure may be patterned to form a bit line structure. If the opening has a small size, the layer structure cannot be patterned in a lower portion of the opening to remain therein, and may cause an electric short between neighboring active patterns.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor device having improved electric characteristics.

Additional aspects will be set forth in part in the description which follows and, in part, will be apparent from the description, or may be learned by practice of the presented embodiments.

According to an aspect of an example embodiment, a semiconductor device may include a first active pattern on a substrate, the first active pattern extending in a third direction having an acute angle with respect to a first direction and a second direction, the first direction and the second direction being substantially parallel to an upper surface of the substrate and substantially perpendicular to each other, a first conductive filling pattern on an upper surface of a central portion of the first active pattern, the first conductive filling pattern having a shape of a parallelogram, a gate structure extending in the first direction in an upper portion of the first active pattern, and a bit line structure on the first conductive filling pattern and extending in the second direction.

According to an aspect of an example embodiment, a semiconductor device may include active patterns on a substrate and spaced apart in a first direction and a second direction, the first direction and the second direction being substantially parallel to an upper surface of the substrate and substantially perpendicular to each other, where each of the active patterns extends in a third direction having an acute angle with respect to the first direction and the second direction, gate structures extending in the first direction in upper portions of the active patterns, the gate structures being spaced apart in the second direction, conductive filling patterns on respective upper surfaces of central portions of the active patterns, an insulating filling pattern on the substrate, the insulating filling pattern contacting sidewalls of the conductive filling patterns, and bit line structures on the conductive filling patterns and the insulating filling pattern, where each of the bit line structures extend in the second direction and are spaced apart in the first direction.

According to an aspect of an example embodiment, a semiconductor device may include active patterns on a substrate and spaced apart in a first direction and a second direction that are substantially parallel to an upper surface of the substrate and substantially perpendicular to each other, where each of the active patterns extend in a third direction having an acute angle with respect to the first direction and the second direction, an isolation pattern on the substrate, the isolation pattern provided on sidewalls of the active patterns, gate structures each extending in the first direction in upper portions of the active patterns and in the isolation pattern, the gate structures being spaced apart in the second direction, conductive filling patterns on respective upper surfaces of central portions of the active patterns, where each of the conductive filling patterns includes an upper surface having a parallelogram shape, an insulating filling pattern on the isolation pattern, the insulating filling pattern contacting sidewalls of the conductive filling patterns, bit line structures on the conductive filling patterns and the insulating filling pattern, where each of the bit line structures extend in the second direction, and are spaced apart in the first direction, a spacer structure on a sidewall of each of the bit line structures, contact plug structures contacting respective upper surfaces of opposite edge portions of the active patterns, and at least one capacitor on each of the contact plug structures.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
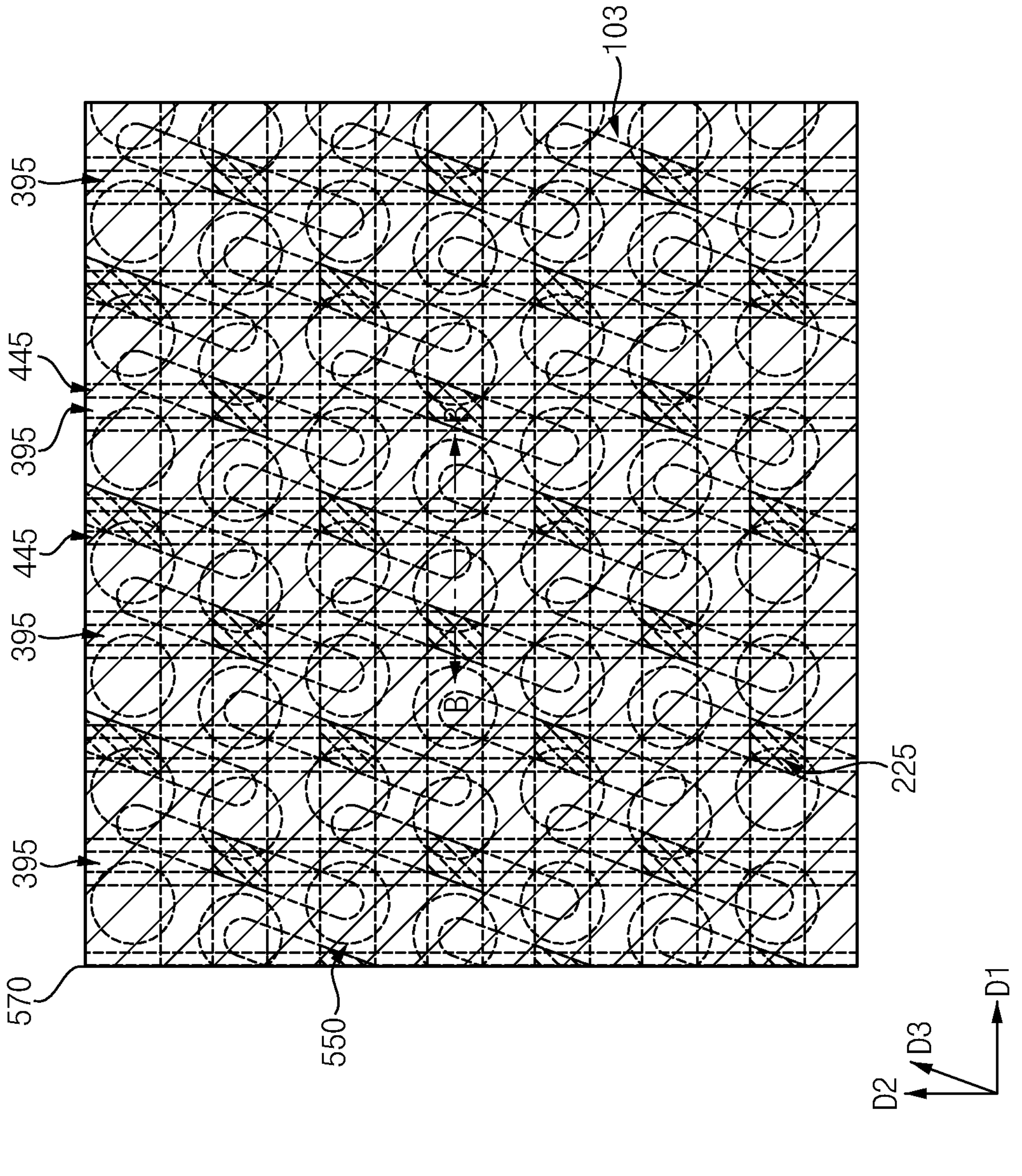
FIG. 1 is a diagram illustrating a semiconductor device according to example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as “at least one of,” when preceding a list of elements, modify the entire list of elements and do not modify the individual elements of the list. For example, the expression, “at least one of a, b, and c,” should be understood as including only a, only b, only c, both a and b, both a and c, both b and c, or all of a, b, and c.

It will be understood that, although the terms “first,” “second,” and/or “third” may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

As disclosed herein, two directions that are substantially perpendicular to each other among horizontal directions, which are substantially parallel to an upper surface of a substrate, may be referred to as first and second directions D1 and D2, respectively, and a direction having an acute angle with respect to the first and second directions D1 and D2 among the horizontal directions may be referred to as a third direction D3. Additionally, a direction substantially perpendicular to the upper surface of the substrate may be referred to as a vertical direction.

Figure 2:
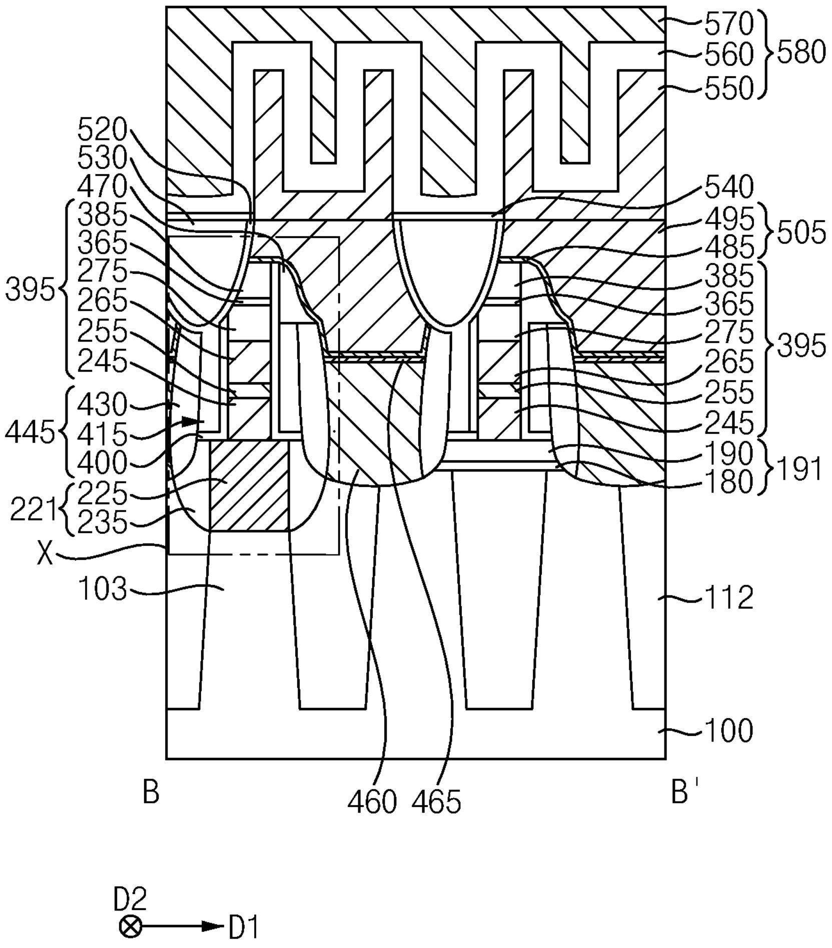
FIG. 2 is a cross-sectional view taken along line A-A' of FIG. 1 according to example embodiments.

FIG. 1 is a diagram illustrating a semiconductor device according to example embodiments. FIG. 2 is a cross-sectional view taken along line A-A' of FIG. 1 according to example embodiments.

Referring to FIGS. 1 and 2, the semiconductor device may include an active pattern 103, a gate structure 170, a filling structure 221, a bit line structure 395, a contact plug structure and a capacitor 580.

The semiconductor device may further include an isolation pattern 112, a spacer structure 445, a second capping pattern 450 (refer to FIG. 17), a fourth spacer 470, an insulation pattern structure 191, third and fourth insulation patterns 520 and 530, and a second etch stop layer 540.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

Figure 3:
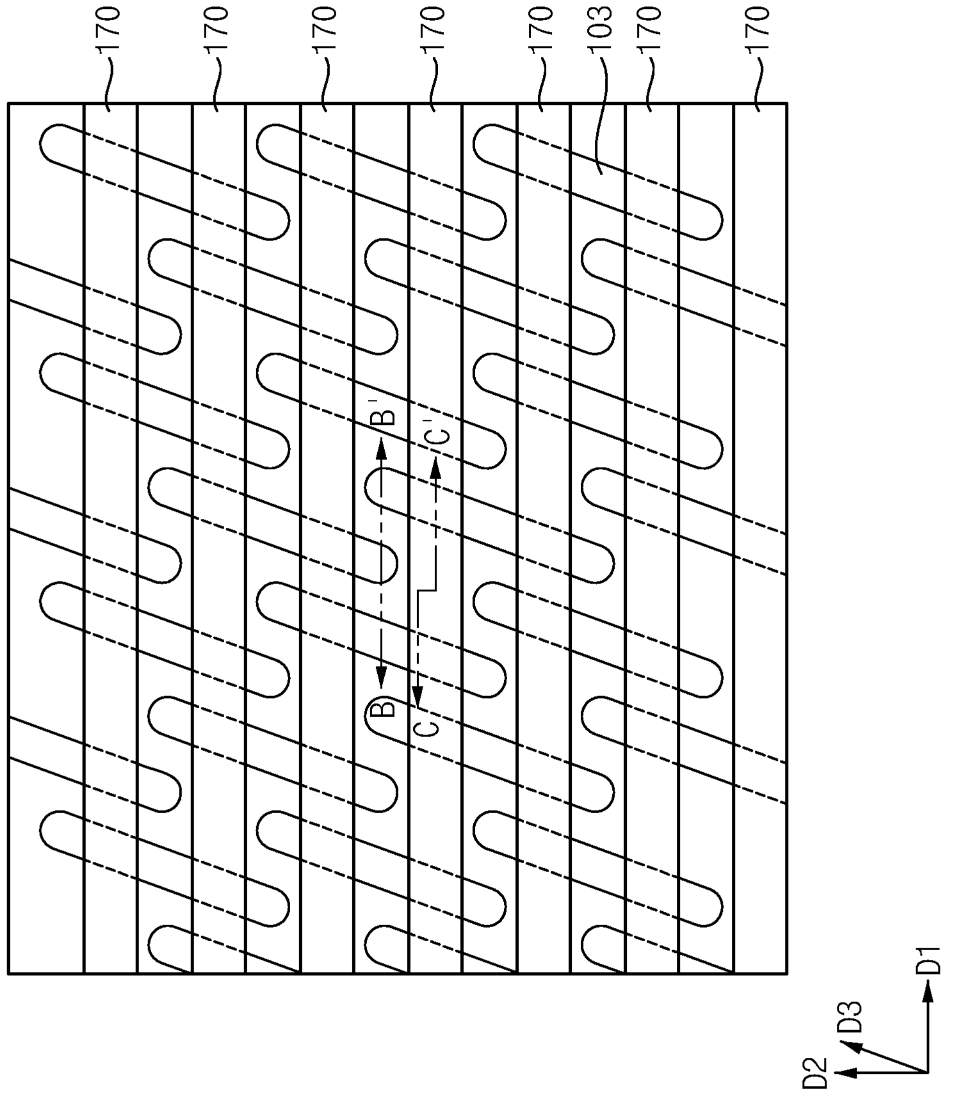
FIGS. 3, 4, 5, 6, 7, 8, 9, 10, 11, 12, 13, 14, 15, 16, 17, 18, 19, 20, 21, 22 and 23 are diagrams illustrating a method of manufacturing a semiconductor device according to example embodiments.
Figure 4:
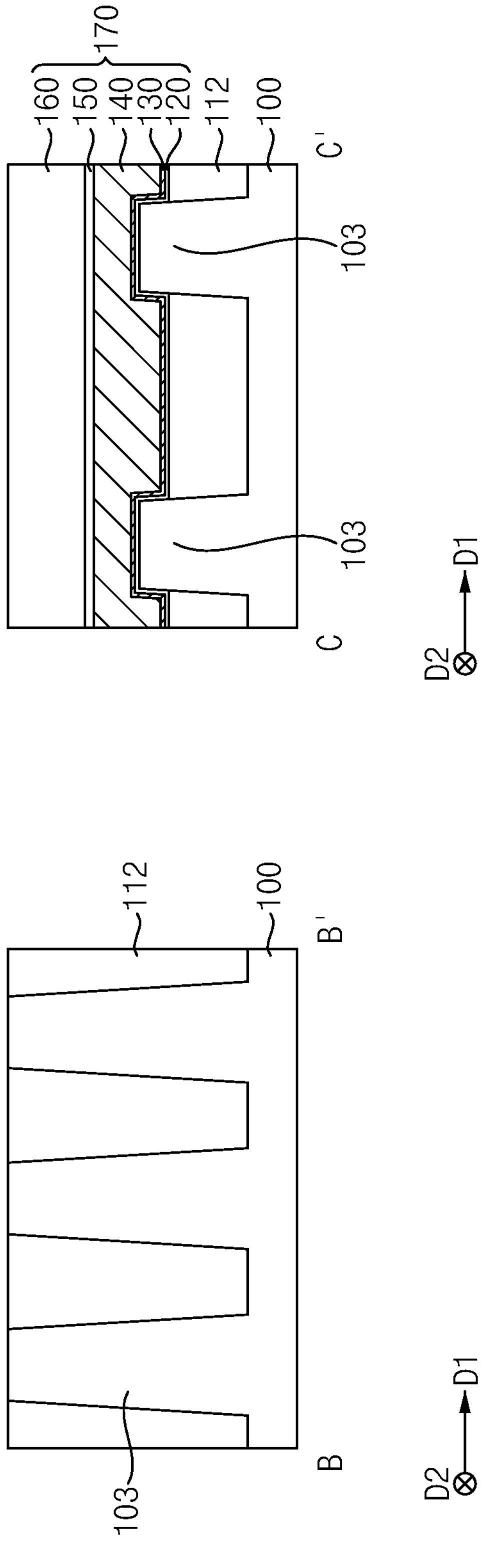

Referring to FIGS. 1 and 2 together with FIGS. 3 and 4, the active pattern 103 may extend in the third direction D3, and a plurality of active patterns 103 may be spaced apart from each other in the first and second directions D1 and D2. A sidewall of the active pattern 103 may be covered by the isolation pattern 112. The active pattern 103 may include a material substantially the same as a material of the substrate 100, and the isolation pattern 112 may include an oxide (e.g., silicon oxide).

Referring to FIGS. 1 and 2 together with FIGS. 3 and 4, the gate structure 170 may be formed in a recess extending in the first direction D1 through upper portions of the active pattern 103 and the isolation pattern 112.

The gate structure 170 may include a gate insulation pattern 120 on a bottom and a sidewall of the recess, a first barrier pattern 130 on a portion of the gate insulation pattern 120 on the bottom and a lower sidewall of the recess, a first conductive pattern 140 on the first barrier pattern 130 and filling a lower portion of the recess, and a second conductive pattern 150 on upper surfaces of the first barrier pattern 130 and the first conductive pattern 140. The gate structure 170 may include a gate mask 160 on an upper surface of the second conductive pattern 150 and an upper inner sidewall of the gate insulation pattern 120, filling an upper portion of the recess. The first barrier pattern 130, the first conductive pattern 140 and the second conductive pattern 150 may collectively form a gate electrode.

The gate insulation pattern 120 may include an oxide (e.g., silicon oxide), the first barrier pattern 130 may include a metal nitride (e.g., titanium nitride, tantalum nitride, etc.), the first conductive pattern 140 may include, for example, a metal, a metal nitride, a metal silicide, etc., the second conductive pattern 150 may include, for example, doped polysilicon, and the gate mask 160 may include a nitride (e.g., silicon nitride).

In example embodiments, the gate structure 170 may extend in the first direction D1, and a plurality of gate structures 170 may be spaced apart from each other in the second direction D2.

Figure 5:
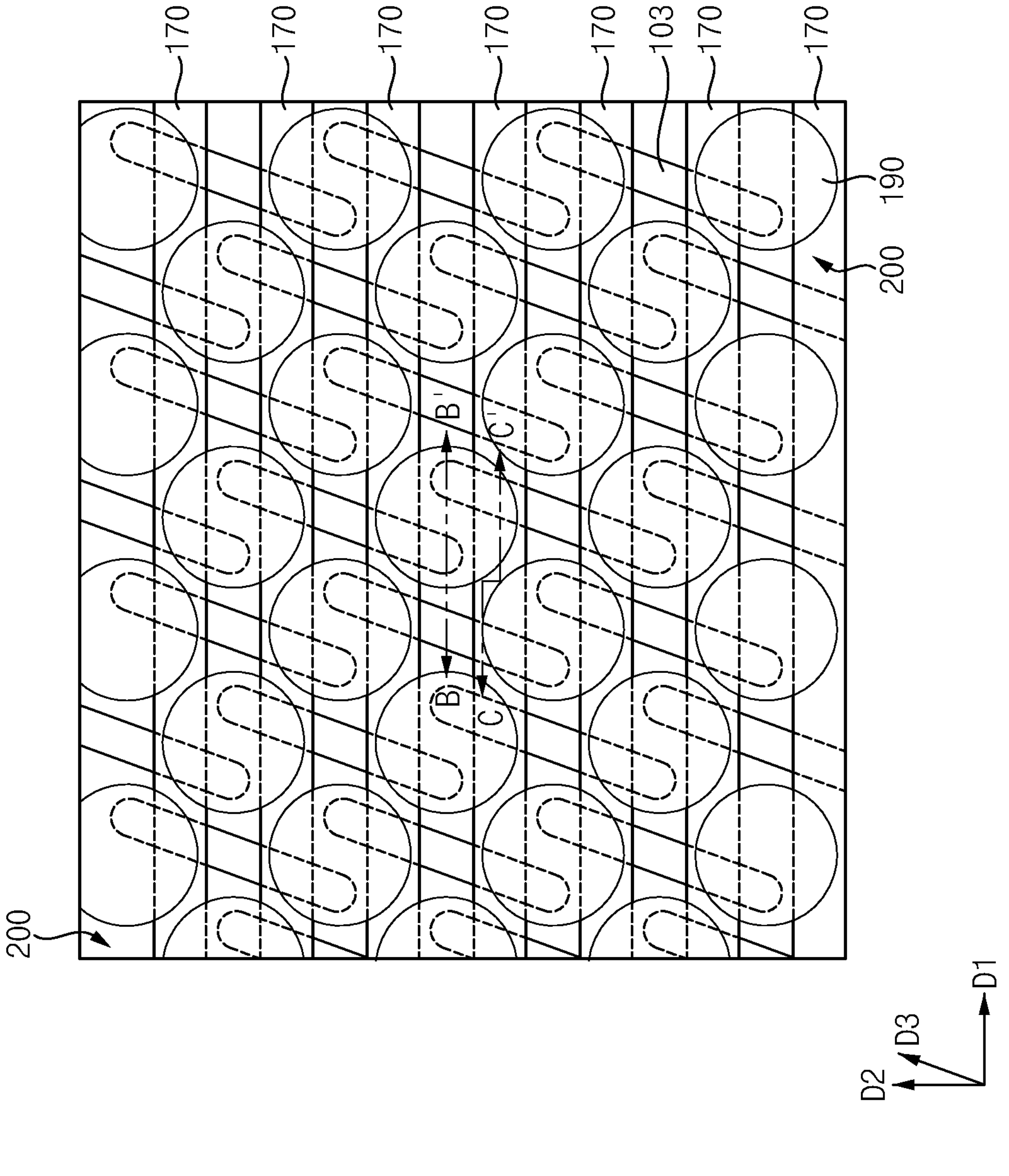
Figure 6:
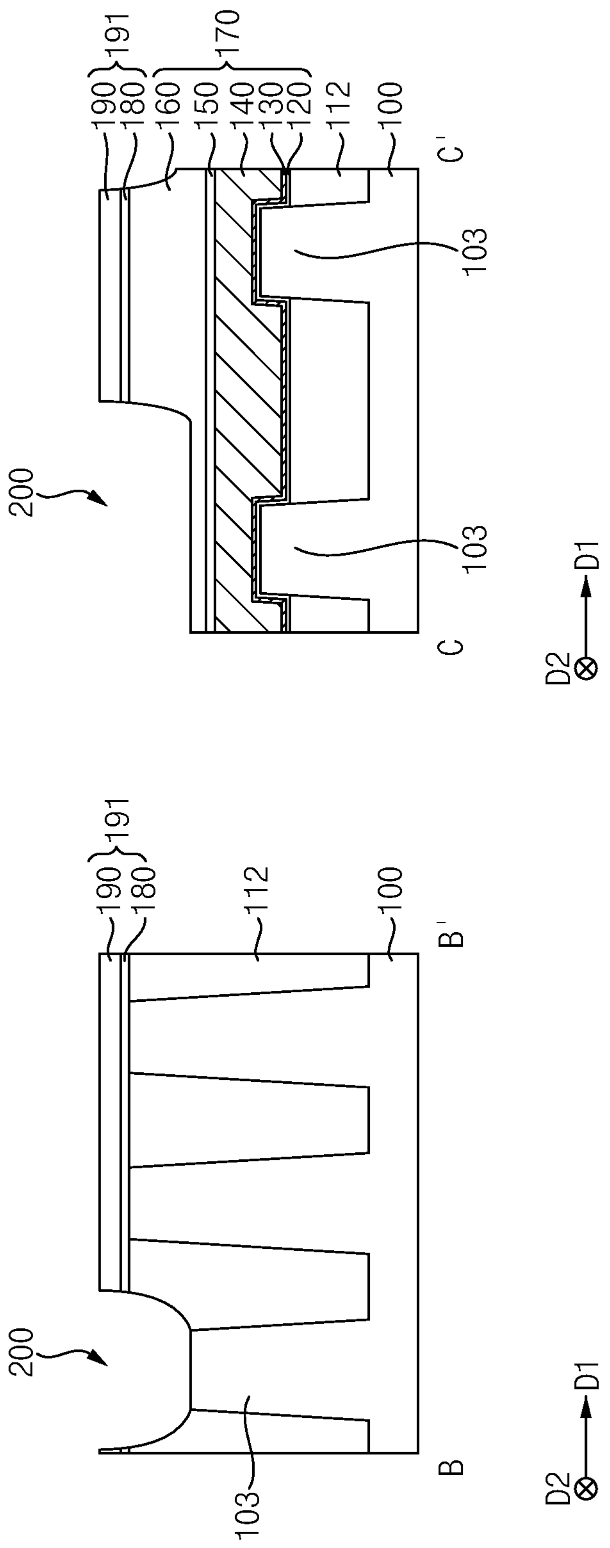

Referring to FIGS. 1 and 2 together with FIGS. 5 and 6, in example embodiments, a plurality of insulation pattern structures may be spaced apart from each other in the first and second directions D1 and D2.

In example embodiments, the insulation pattern structure 191 may, in the vertical direction, overlap an end portion of the active pattern 103 extending in the third direction D3 and, in the first direction D1, overlap a portion of the isolation pattern 112 adjacent to the end portion of the active pattern 103.

In example embodiments, the insulation pattern structure 191 may include first and second insulation patterns 180 and 190 sequentially stacked in the vertical direction. The first insulation pattern 180 may include an oxide (e.g., silicon oxide), and the second insulation pattern 190 may include an insulating nitride (e.g., silicon nitride).

Figure 10:
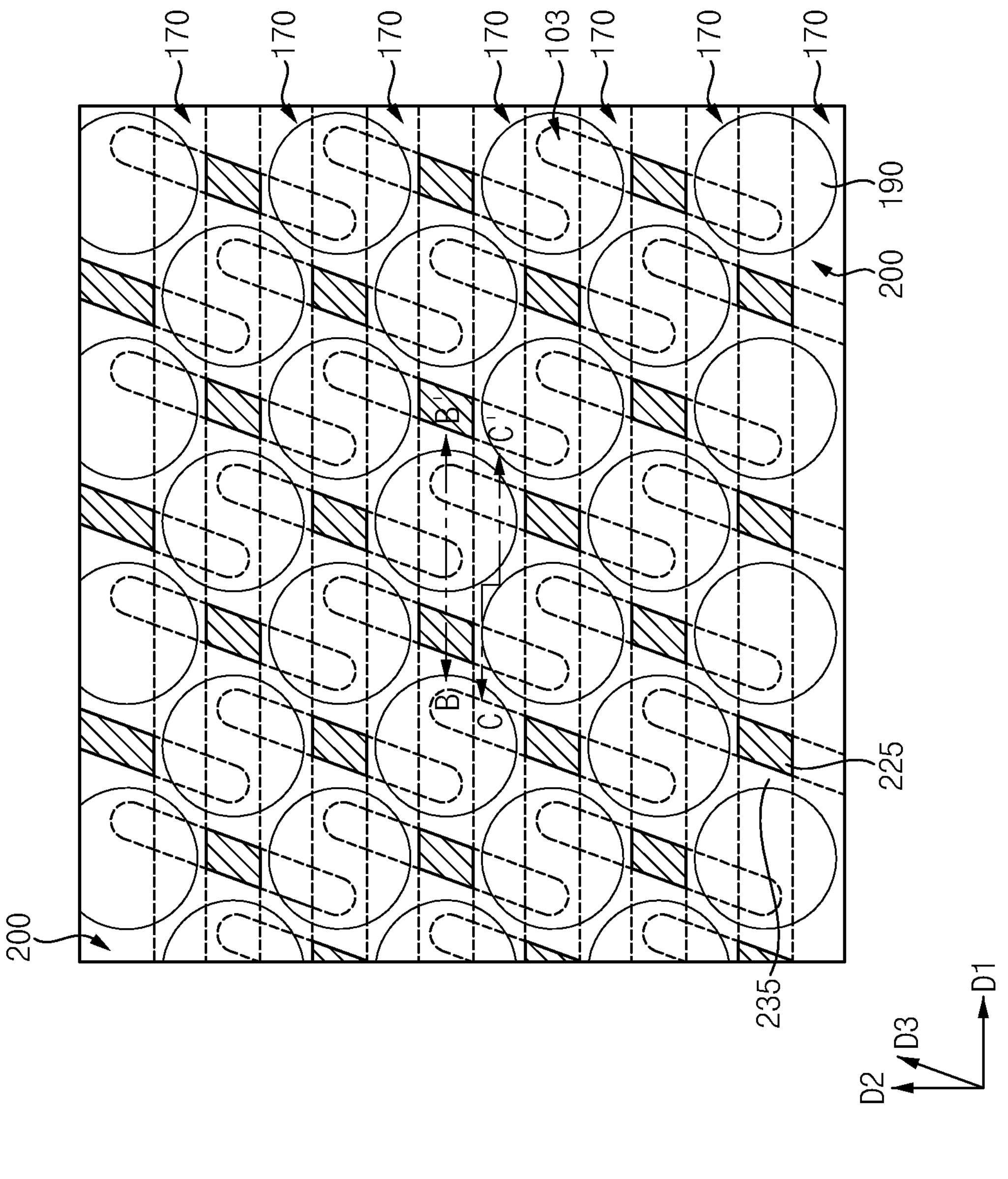
Figure 11:
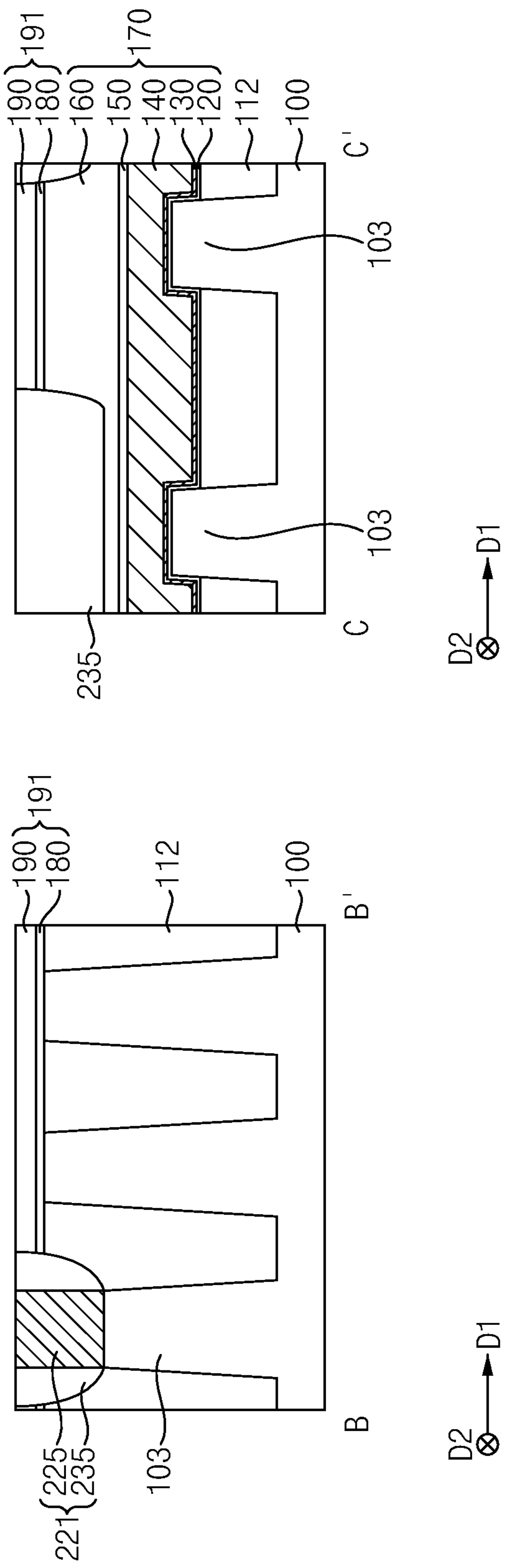

Referring to FIGS. 1 and 2 together with FIGS. 10 and 11, a first opening 200 may extend through the insulation pattern structure 191 to expose upper surfaces of the active pattern 103, the isolation pattern 112 and the gate structure 170, and an upper surface of a central portion in the third direction D3 of the active pattern 103 may be exposed by the first opening 200.

In example embodiments, an area of a lower surface of the first opening 200 may be greater than an area of the upper surface of the active pattern 103 exposed by the first opening 200. Thus, the first opening 200 may also expose an upper surface of a portion of the isolation pattern 112 adjacent to the active pattern 103. Additionally, the first opening 200 may extend through an upper portion of the active pattern 103 and an upper portion of the isolation pattern 112 adjacent thereto, and thus a bottom of the first opening 200 may be lower than an upper surface of a portion of the active pattern 103 on which the first opening 200 is not formed (i.e., the bottom of the first opening 200 may be lower an upper surface of each of opposite end portions of the active pattern 103).

In example embodiments, the filling structure 221 may include a conductive filling pattern 225 and an insulating filling pattern 235. The conductive filling pattern 225 may be formed on the upper surface of the active pattern 103 exposed by the first opening 200, and the insulating filling pattern 235 may be formed on the isolation pattern 112 and the gate mask 160 to cover a sidewall of the conductive filling pattern 225.

In example embodiments, a plurality of conductive filling patterns 225 may be spaced apart from each other in the first and second directions D1 and D2, and the insulating filling pattern 235 may contact sidewalls of the plurality of conductive filling patterns 225.

In example embodiments, the conductive filling pattern 225 may have a shape of a square pillar, and may have a shape of a parallelogram in a plan view. That is, each of lower and upper surfaces of the conductive filling pattern 225 may have a shape of a parallelogram. The conductive filling pattern 225 may include first sidewalls opposite each other in the second direction D2 and second sidewalls opposite each other in a fourth direction substantially parallel to the upper surface of the substrate 100 and substantially perpendicular to the third direction D3. The first and second sidewalls of the conductive filling pattern 225 may be covered by the insulating filling pattern 235.

In example embodiments, upper surfaces of the conductive filling pattern 225 and the insulating filling pattern 235 may be substantially coplanar with an upper surface of the insulation pattern structure 191.

The conductive filling pattern 225 may include polysilicon doped with, for example, n-type impurities such as phosphorus or p-type impurities such as boron. In an example embodiment, the insulation filling pattern 235 may include an oxide (e.g., silicon oxide), an insulating nitride (e.g., silicon nitride), or a low-k dielectric material (e.g., silicon oxycarbide). Alternatively, the insulation filling pattern 235 may include a metal oxide (e.g., aluminum oxide, zinc oxide, titanium oxide, hafnium oxide, indium oxide, etc.).

Figure 13:
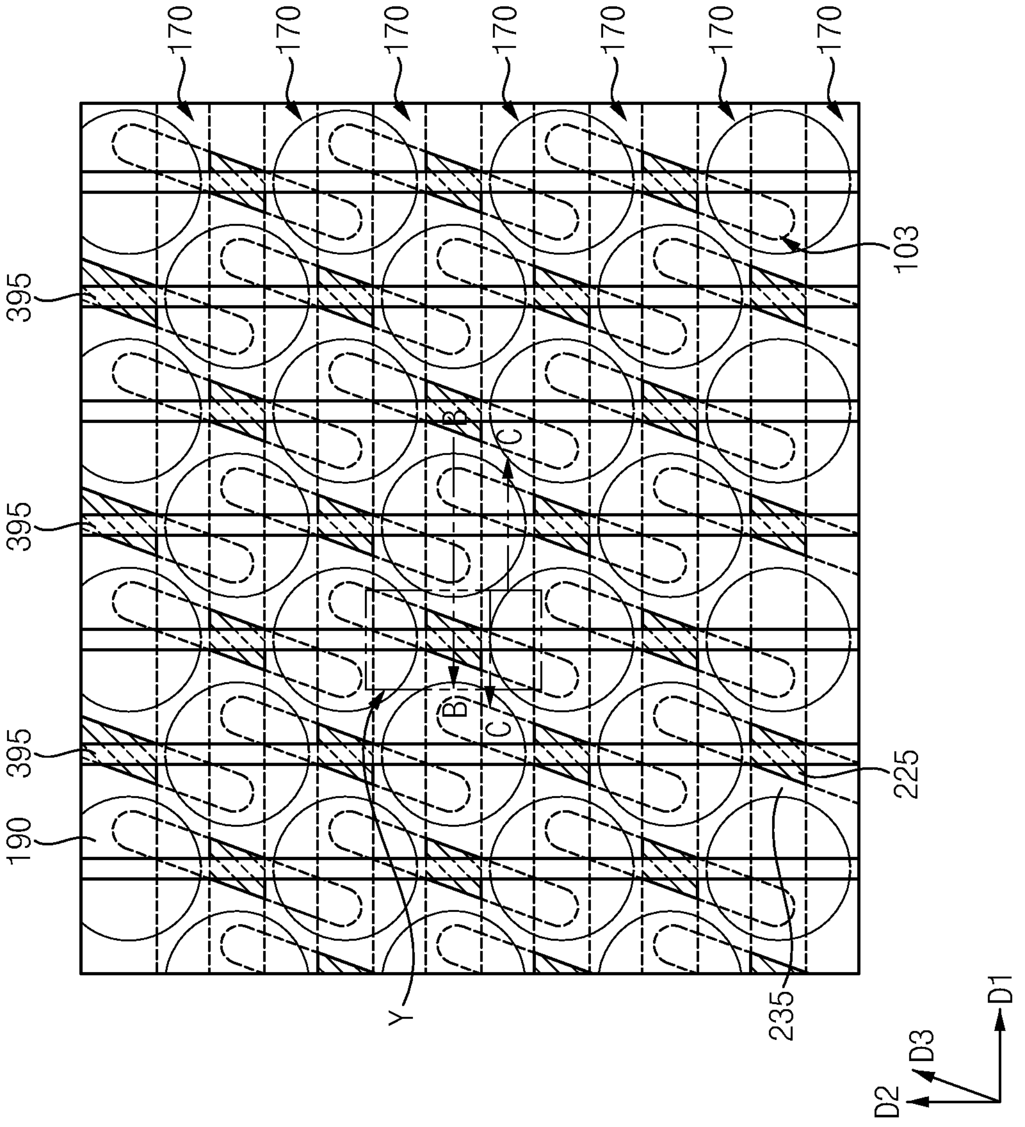
Figure 14:
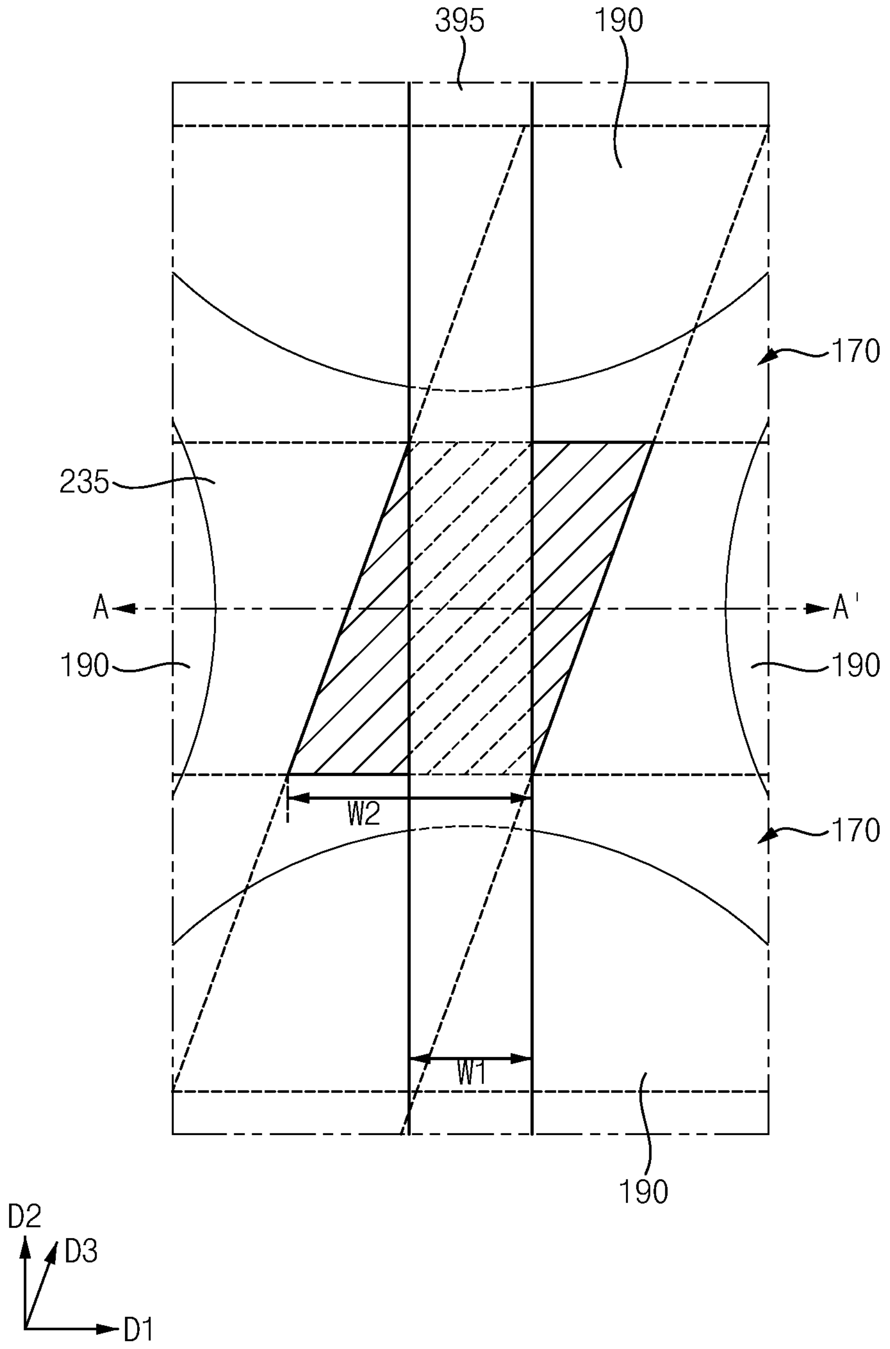
Figure 15:
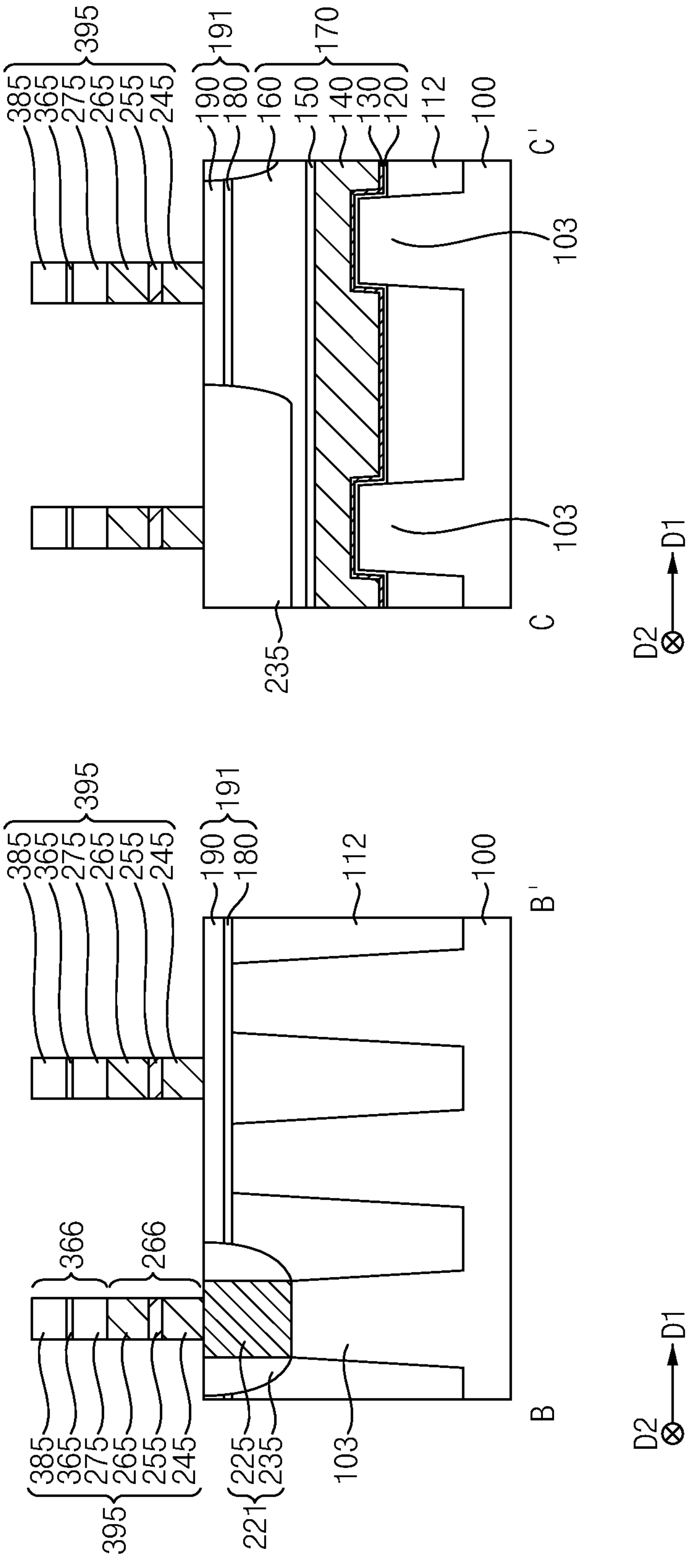

Referring to FIGS. 1 and 2 together with FIGS. 13 to 15, the bit line structure 395 may include a third conductive pattern 245, a second barrier pattern 255, a fourth conductive pattern 265, a first mask 275, a first etch stop pattern 365 and a first capping pattern 385 sequentially stacked in the vertical direction on the filling structure 221 and the insulation pattern structure 191. The third conductive pattern 245, the second barrier pattern 255 and the fourth conductive pattern 265 may collectively form a conductive structure 266, and the first mask 275, the first etch stop pattern 365 and the first capping pattern 385 may form an insulation structure 366. In an example embodiment, the first mask 275, the first etch stop pattern 365 and the first capping pattern 385 sequentially stacked may be merged with each other to form a single insulation structure.

In example embodiments, the bit line structure 395 may extend in the second direction D2 on substrate 100, and a plurality of bit line structures 395 may be spaced apart from each other in the first direction D1.

In example embodiments, the bit line structure 395 may contact the upper surface of the conductive filling pattern 225 included in the filling structure 221. In an example embodiment, a first width W1 in the first direction D1 of the bit line structure 395 may be less than a second width W2 in the first direction D1 of the conductive filling pattern 225.

A width in the first direction D1 of the conductive filling pattern 225 having lower and upper surfaces of a parallelogram shape may be constant, and the width may be referred to as the second width W2. Alternatively, if the lower and upper surfaces of the conductive filling pattern 225 do not have a parallelogram shape, a mean value of widths in the first direction D1 of the conductive filling pattern 225 may be referred to as the second width W2.

In example embodiments, a portion of the upper surface of the conductive filling pattern 225 may not be covered by the bit line structure 395.

The third conductive pattern 245 may include polysilicon doped with n-type impurities or p-type impurities, the second barrier pattern 255 may include a metal nitride (e.g., titanium nitride, tantalum nitride, tungsten nitride, etc.), the fourth conductive pattern 265 may include a metal (e.g., tungsten, titanium, tantalum, ruthenium, etc.), and each of the first mask 275, the first etch stop pattern 365 and the first capping pattern 385 may include an insulating nitride (e.g., silicon nitride).

The contact plug structure may include a lower contact plug 460, an ohmic contact pattern 465 and an upper contact plug 505 sequentially stacked in the vertical direction on the active pattern 103.

The lower contact plug 460 may contact an upper surface of each of opposite edge portions in the third direction D3 of the active pattern 103. In example embodiments, a plurality of lower contact plugs 460 may be spaced apart from each other in the second direction D2 between neighboring ones of the bit line structures 395 in the first direction D1, and the second capping pattern 450 may be formed between neighboring ones of the lower contact plugs 460 in the second direction D2. The second capping pattern 450 may include an insulating nitride (e.g., silicon nitride).

The lower contact plug 460 may include, for example, doped polysilicon, the ohmic contact pattern 465 may include, for example, titanium silicide, cobalt silicide, nickel silicide, etc.

In an example embodiment, the upper contact plug 505 may include a second metal pattern 495 and a third barrier pattern 485 covering a lower surface of the second metal pattern 495. In example embodiments, a plurality of upper contact plugs 505 may be spaced apart from each other in the first and second directions D1 and D2, and may be arranged in a honeycomb pattern or a lattice pattern in a plan view. Each of the upper contact plugs 505 may have a shape of, for example, a circle, an ellipse or a polygon.

The spacer structure 445 may include a first spacer 400 covering a sidewall of the bit line structure 395 and an upper surface of a portion of the filling structure 221, an air spacer 415 on an outer sidewall of the first spacer 400, and a third spacer 430 covering an outer sidewall of the air spacer 415, an upper surface of a portion of the filling structure 221 and a sidewall of the insulation pattern structure 191.

The first spacer 400 may include an insulating nitride (e.g., silicon nitride), the air spacer 415 may include air, and the third spacer 430 may include an insulating nitride (e.g., silicon nitride).

The fourth spacer 470 may be formed on an outer sidewall of a portion of the first spacer 400 on an upper sidewall of the bit line structure 395, and may cover a top end of the air spacer 415 and an upper surface of the third spacer 430. The fourth spacer 470 may include an insulating nitride (e.g., silicon nitride).

Each of the third and fourth insulation patterns 520 and 530 may include an oxide (e.g., silicon oxide), or an insulating nitride (e.g., silicon nitride).

The second etch stop layer 540 may be formed on the third and fourth insulation patterns 520 and 530, the upper contact plug 505 and the second capping pattern 450.

The capacitor 580 may be formed on the upper contact plug 505, and may include a lower electrode 550 having a pillar shape or a cylindrical shape, a dielectric layer 560 on a surface of the lower electrode 550, and an upper electrode 570 on the dielectric layer 560.

The lower electrode 550 may include, for example, a metal, a metal nitride, a metal silicide, doped polysilicon, the dielectric layer 560 may include, for example, a metal oxide, and the upper electrode 570 may include, for example, a metal, a metal nitride, a metal silicide, doped silicon-germanium, etc. In an example embodiment, the upper electrode 570 may include a first electrode including a metal or a metal nitride, and a second upper electrode including doped silicon-germanium.

In the semiconductor device, the conductive filling pattern 225 may be formed between the active pattern 103 and the bit line structure 395, and may electrically connect the active pattern 103 and the bit line structure 395. The sidewall of the conductive filling pattern 225 may be covered by the insulating filling pattern 235. In example embodiments, the conductive filling pattern 225 may be formed only on the upper surface of the active pattern 103, and may be electrically insulated from neighboring active pattern 103 by the insulating filling pattern 235. Thus, electric short or leakage current may be reduced.

FIGS. 3, 4, 5, 6, 7, 8, 9, 10, 11, 12, 13, 14, 15, 16, 17, 18, 19, 20, 21, 22 and 23 are diagrams illustrating a method of manufacturing a semiconductor device according to example embodiments.

Particularly, FIGS. 3, 5, 7, 10, 13, 18 and 22 are the plan views, each of FIGS. 4, 6, 8-9, 11-12 and 15 includes cross-sections taken along lines B-B' and C-C' of a corresponding plan view, and FIGS. 16-17, 19-21 and 23 are cross-sectional views taken along lines B-B' of corresponding plan views, respectively. FIG. 14 is an enlarged plan view of region Y of FIG. 13.

Referring to FIGS. 3 and 4, an active pattern 103 may be formed on a substrate 100, and an isolation pattern 112 may be formed to cover a sidewall of the active pattern 103.

The active pattern 103 may be formed by removing an upper portion of the substrate 100 to form a first recess, and a plurality of active patterns 103 each of which may extend in the third direction D3 may be formed to be spaced apart from each other in the first and second directions D1 and D2.

The active pattern 103 and the isolation pattern 112 may be partially etched to form a second recess extending in the first direction D1, and a gate structure 170 may be formed in the second recess. In example embodiments, the gate structure 170 may extend in the first direction D1, and a plurality of gate structures 170 may be formed to be spaced apart from each other in the second direction D2.

Referring to FIGS. 5 and 6, an insulation layer structure including first and second insulation layers sequentially stacked may be formed on the substrate 100, and may be patterned to form an insulation pattern structure 191 including first and second insulation patterns 180 and 190.

In example embodiments, the insulation pattern structure 191 may have a shape of a circle or an ellipse in a plan view, and a plurality of insulation pattern structures may be spaced apart from each other in the first and second directions D1 and D2. Each of the insulation pattern structures may overlap in the vertical direction edge portions in the third direction D3 of neighboring ones of the active patterns 103 that may face each other in the first direction D1.

The active pattern 103, the isolation pattern 112 and the gate mask 160 of the gate structure 170 may be partially etched using the insulation pattern structure 191 as an etching mask to form a first opening 200.

Figure 7:
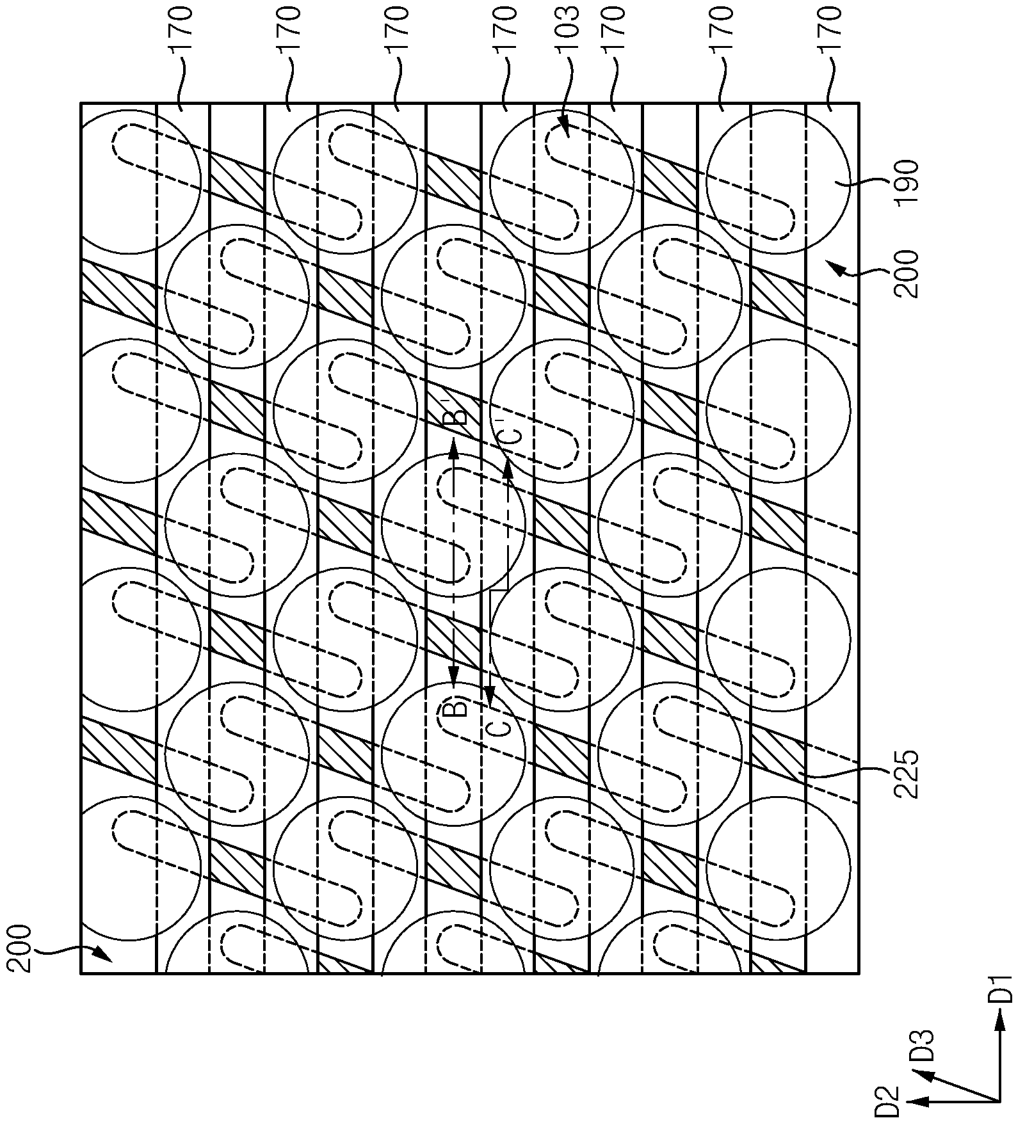
Figure 8:
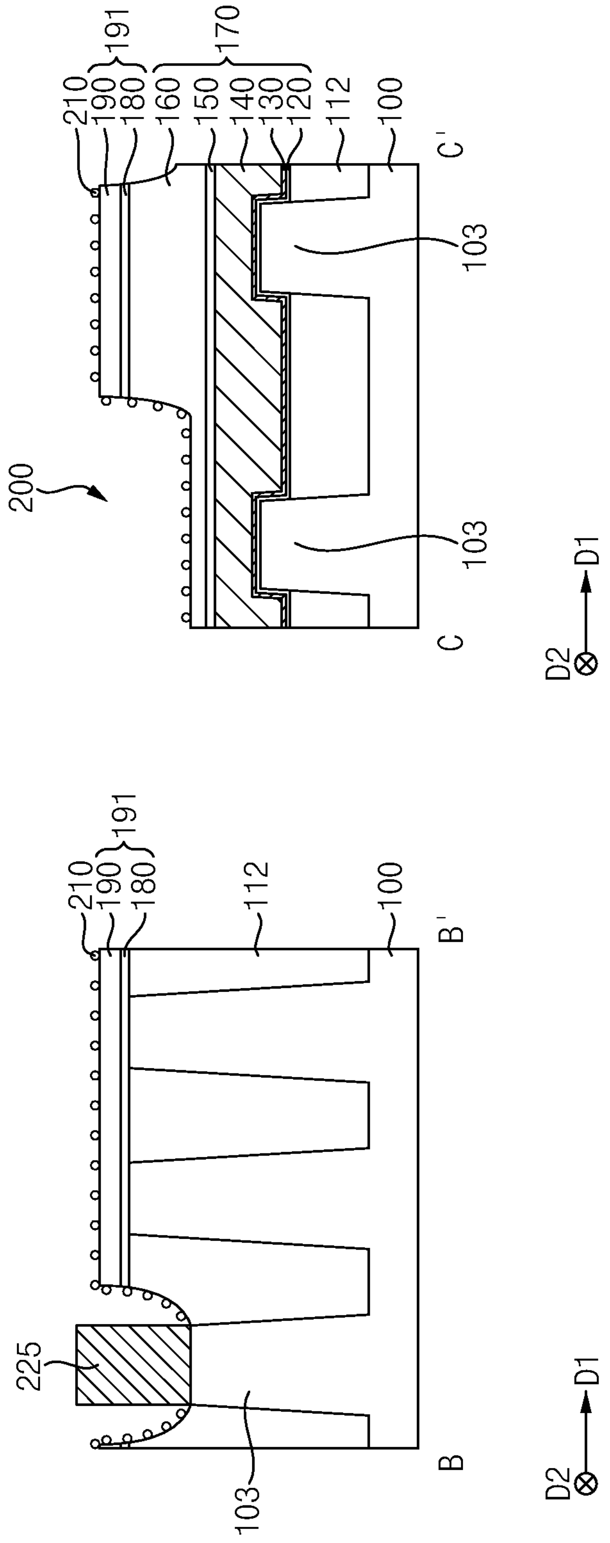

Referring to FIGS. 7 and 8, a conductive filling pattern 225 may be formed on an upper surface of the active pattern 103.

In example embodiments, the conductive filling pattern 225 may be formed by a selective deposition process (e.g., a chemical vapor deposition (CVD) process) in which the conductive filling pattern 225 is selectively deposited only on the upper surface of the active pattern 103 include silicon. An upper surface of the conductive filling pattern 225 may be substantially coplanar or higher than an upper surface of the insulation pattern structure 191.

In example embodiments, the conductive filling pattern 225 may have a shape of a square pillar. The conductive filling pattern 225 may have a shape of a parallelogram in a plan view. Thus, the conductive filling pattern 225 may have first sidewalls opposite each other in the second direction D2 and second sidewalls opposite each other in a fourth direction substantially perpendicular to the third direction D3.

The selective deposition process may be performed using a silicon source gas (e.g., $Si_2H_6$ and hydrogen gas), and the conductive filling pattern 225 may be formed only on the active pattern 103 including silicon by controlling a ratio between the silicon source gas and the hydrogen gas.

The selective deposition process may be performed using the silicon source gas and the hydrogen gas together with an n-type impurity source gas (e.g., $PH_3$ or a p-type impurity source gas, such as $BCl_3$), and thus the conductive filling pattern 225 may include polysilicon doped with n-type impurities (e.g., phosphorus) or p-type impurities (e.g., boron).

In an example embodiment, before or during the selective deposition process, a first inhibitor 210 may be coated on the isolation pattern 112 and the insulation pattern structure 191 including insulating materials, such that the conductive filling pattern 225 may be formed only on the upper surface of the active pattern 103. The first inhibitor 210 may include a gas containing chlorine (e.g., $SiH_2Cl_2$, $SiHCL_3$, $SiCl_4$, $Cl_2$, etc.).

Alternatively, during the selective deposition process, a nucleation delay may be used, or an atomic layer etching (ALE) process may also be performed, such that the conductive filling pattern 225 may not be formed on the isolation pattern 112 and the insulation pattern structure 191.

Figure 9:
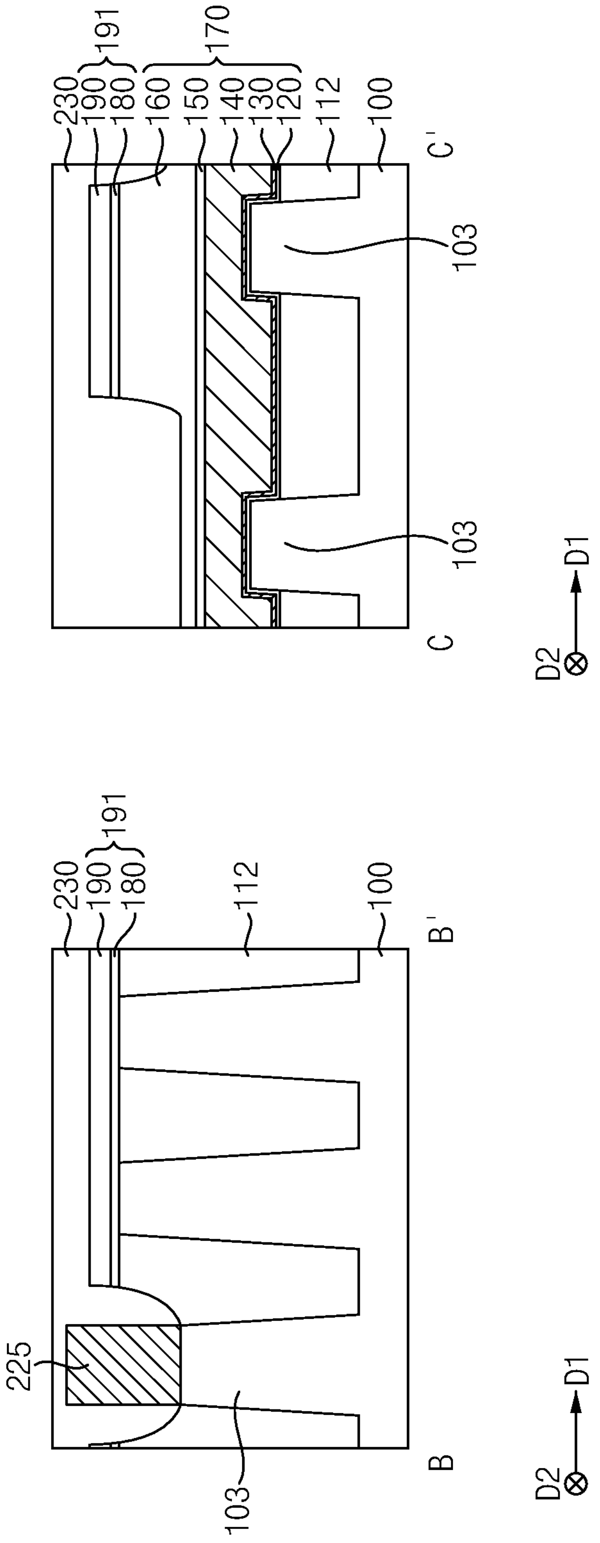

Referring to FIG. 9, if the first inhibitor 210 is coated, the first inhibitor 210 may be removed, and an insulating filling layer 230 may be formed on the conductive filling pattern 225 and the insulation pattern structure 191.

The insulating filling layer 230 may be formed by, for example, a chemical vapor deposition (CVD) process or an atomic layer deposition (ALD) process. The insulating filling layer 230 may cover the first and second sidewalls of the conductive filling pattern 225.

Referring to FIGS. 10 and 11, an upper portion of the insulating filling layer 230 may be planarized until the upper surface of the insulation pattern structure 191 is exposed, and thus an insulating filling pattern 235 may be formed in a remaining portion of the first opening 200.

In example embodiments, the planarization process may include a chemical mechanical polishing (CMP) process and/or an etch back process.

The conductive filling pattern 225 and the insulating filling pattern 235 in the first opening 200 may form a filling structure 221.

Figure 12:
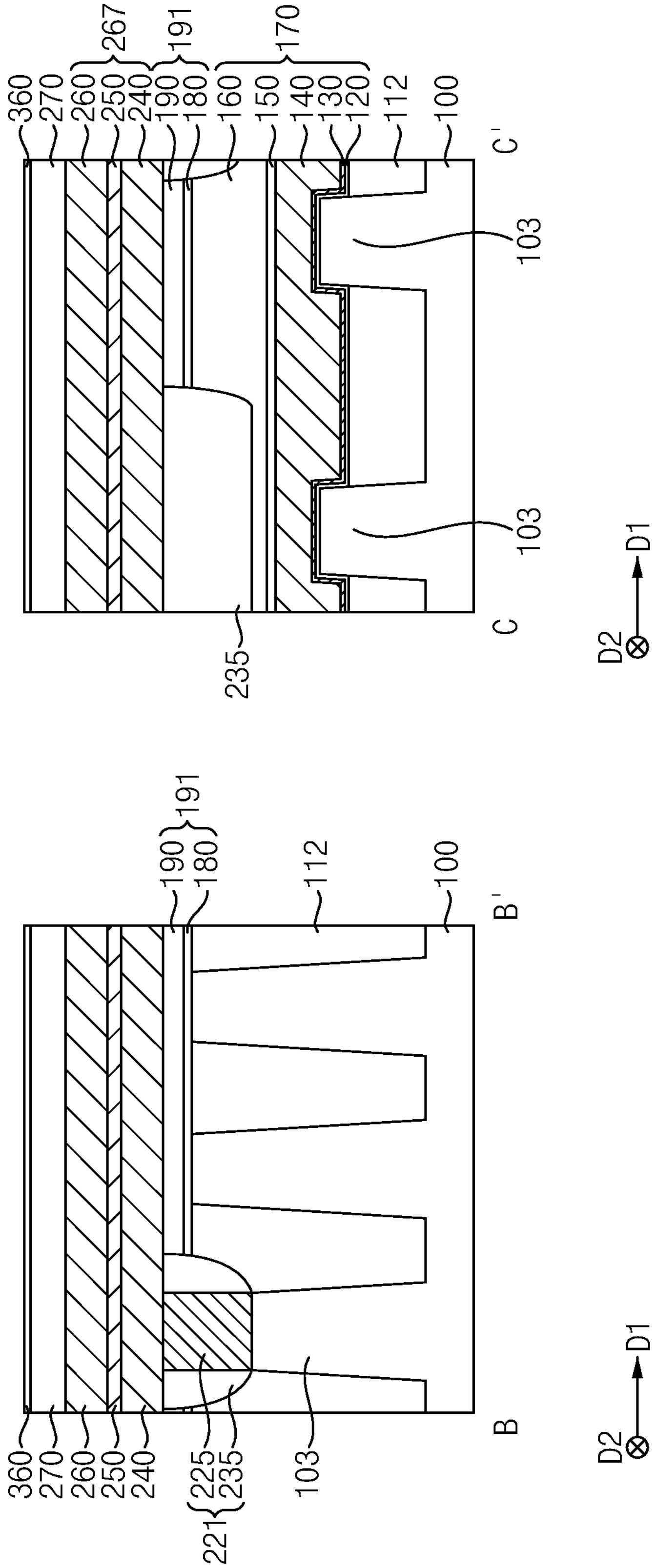

Referring to FIG. 12, a third conductive layer 240, a second barrier layer 250, a fourth conductive layer 260, a first mask layer 270 and a first etch stop layer 360 may be sequentially stacked on the insulation pattern structure 191 and the filling structure 221, and the third conductive layer 240, the second barrier layer 250 and the fourth conductive layer 260 may collectively form a conductive structure layer 267.

Referring to FIGS. 13 to 15, a first capping layer may be formed on the first etch stop layer 360, and may be patterned to form a first capping pattern 385.

In example embodiments, the first capping pattern 385 may extend in the second direction D2, and a plurality of first capping patterns 385 may be spaced apart from each other in the first direction D1.

The first etch stop layer 360, the first mask layer 270, the fourth conductive layer 260, the second barrier layer 250 and the third conductive layer 240 may be sequentially etched using the first capping pattern 385 as an etching mask.

By the etching process, a third conductive pattern 245, a second barrier pattern 255, a fourth conductive pattern 265, a first mask 275, a first etch stop pattern 365 and a first capping pattern 385 sequentially stacked may be formed on the filling structure 221 and the insulation pattern structure 191.

Hereinafter, the third conductive pattern 245, the second barrier pattern 255, the fourth conductive pattern 265, the first mask 275, the first etch stop pattern 365 and the first capping pattern 385 sequentially stacked may be referred to as a bit line structure 395. The bit line structure 395 may include a conductive structure 266 having the third conductive pattern 245, the second barrier pattern 255 and the fourth conductive pattern 265 and an insulation structure 366 having the first mask 275, the first etch stop pattern 365 and the first capping pattern 385. In example embodiments, the bit line structure 395 may extend in the second direction D2 on the substrate 100, and a plurality of bit line structures 395 may be spaced apart from each other in the first direction D1.

In example embodiments, the bit line structure 395 may contact an upper surface of the conductive filling pattern 225 included in the filling structure 221. In an example embodiment, a first width W1 in the first direction D1 of the bit line structure 395 may be less than a second width W2 in the first direction D1 of the conductive filling pattern 225. Additionally, a portion of the upper surface of the conductive filling pattern 225 may not be covered by the bit line structure 395.

Figure 16:
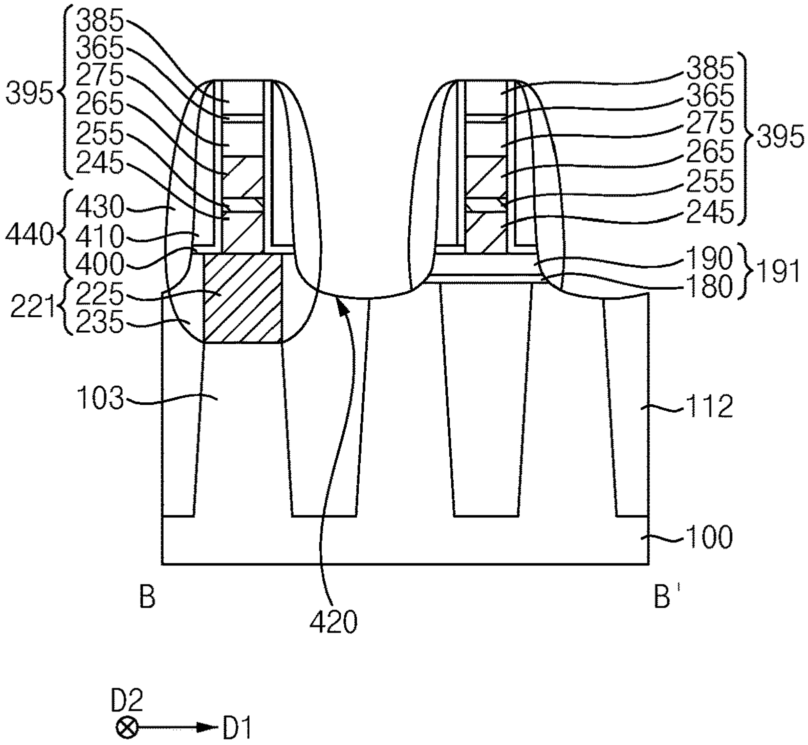

Referring to FIG. 16, a first spacer layer may be formed on the bit line structure 395, the filling structure 221 and the insulation pattern structure 191, and a second spacer layer may be formed on the first spacer layer.

The second spacer layer may be anisotropically etched to form a second spacer 410 on the first spacer layer to cover a sidewall of the bit line structure 395, and a dry etching process may be performed using the first capping pattern 385 and the second spacer 410 as an etching mask to form a second opening 420 exposing an upper surface of the active pattern 103. Upper surfaces of the isolation pattern 112 and the gate mask 160 may also be partially exposed by the second opening 420.

By the dry etching process, a portion of the first spacer layer on upper surfaces of the first capping pattern 385 and the second insulation pattern 190 may be removed, and thus a first spacer 400 covering the sidewall of the bit line structure 395 may be formed. Additionally, other portions of the first and second insulation patterns 180 and 190 included in the insulation pattern structure 191 that are not adjacent to the bit line structure 395 may also be removed.

A third spacer layer may be formed on the upper surface of the first capping pattern 385, an outer sidewall of the second spacer 410, and the upper surfaces of the active pattern 103, the isolation pattern 112 and the gate mask 160 exposed by the second opening 420. The third spacer layer may be anisotropically etched to form a third spacer 430 covering the sidewall of the bit line structure 395.

The first spacer 400, the second spacer 410 and the third spacer 430 sequentially stacked in the horizontal direction on the sidewall of the bit line structure 395 may be referred to as a preliminary spacer structure 440.

Figure 17:
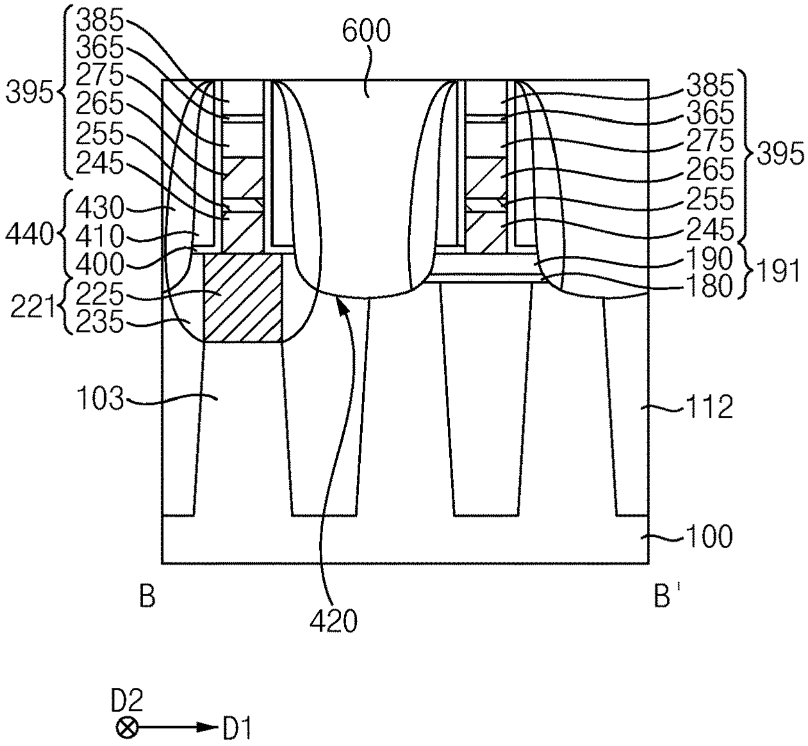

Referring to FIG. 17, a first sacrificial layer 600 may be formed on the substrate 100 to fill the second opening 420, and may be planarized until the upper surface of the first capping pattern 385 is exposed.

In example embodiments, the first sacrificial layer 600 may extend in the second direction D2, and a plurality of first sacrificial layers 600 may be spaced apart from each other in the first direction D1 by the bit line structure 395. The first sacrificial layer 600 may include an oxide (e.g., silicon oxide).

Figure 18:
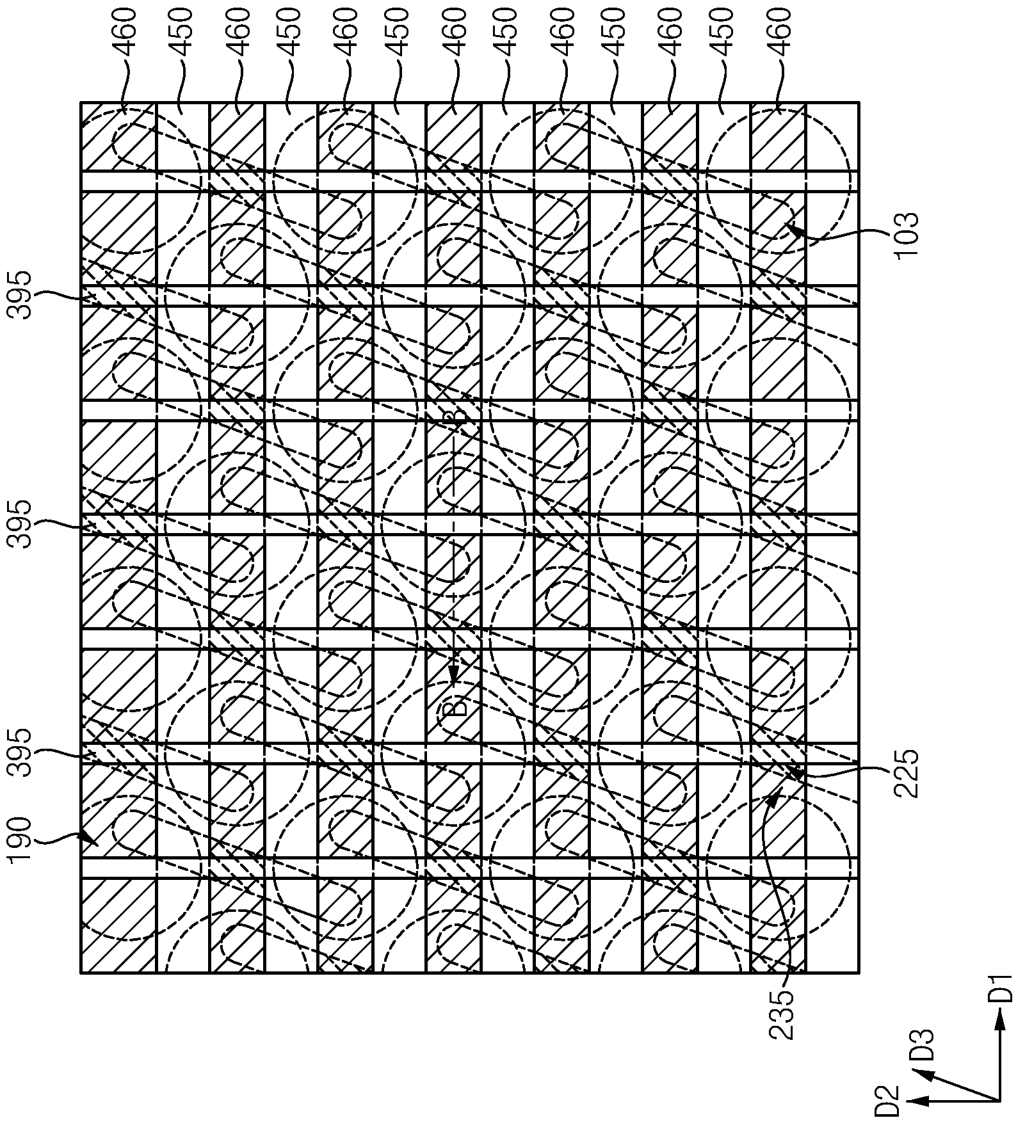
Figure 19:
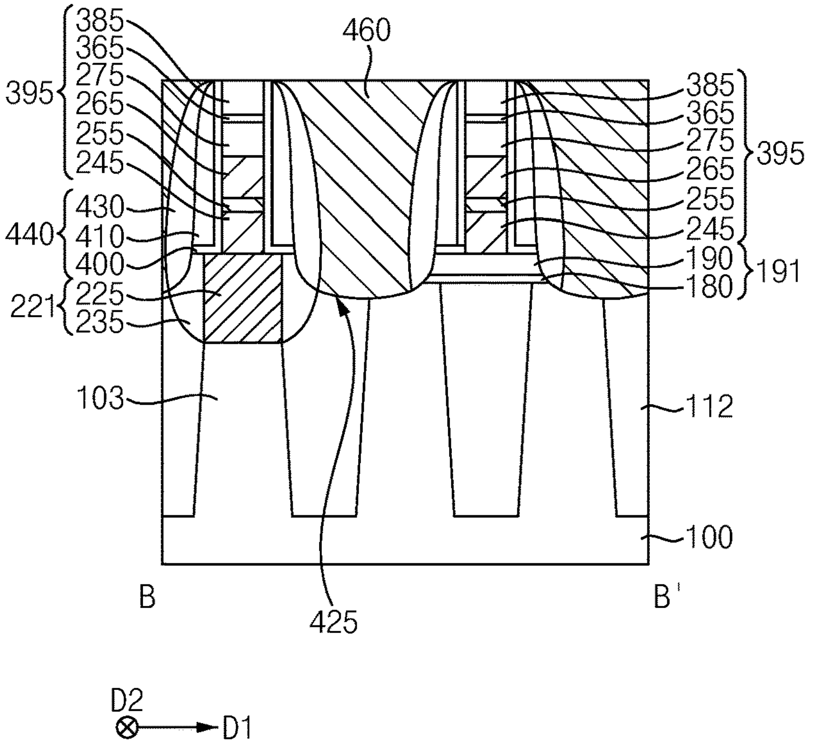

Referring to FIGS. 18 and 19, a second mask including a plurality of third openings, each of which may extend in the first direction D1, spaced apart from each other in the second direction D2 may be formed on the first capping pattern 385 and the first sacrificial layer 600, and the first sacrificial layer 600 may be etched using the second mask as an etching mask to form a fourth opening exposing an upper surface of the gate mask 160 of the gate structure 170.

In example embodiments, each of the fourth openings may overlap the gate structure 170 in the vertical direction, and a plurality of fourth openings may be spaced apart from each other in the second direction D2 between neighboring bit line structures 395 in the first direction D1.

After removing the second mask, a second capping pattern 450 may be formed to fill each of the fourth openings. According to the layout of the fourth openings, a plurality of second capping patterns 450 may be spaced apart from each other in the second direction D2 between neighboring bit line structures 395 in the first direction D1.

The first sacrificial layer 600 may be divided into a plurality of parts spaced apart from each other in the second direction D2 between the bit line structures 395.

The first sacrificial layer 600 may be removed to form a fifth opening 425 partially exposing the upper surfaces of the active pattern 103 and the isolation pattern 112. A plurality of fifth openings 425 may be spaced apart from each other in the second direction D2 between the bit line structures 395.

A lower contact plug layer may be formed to fill the fifth openings 425, and may be planarized until upper surfaces of the first and second capping patterns 385 and 450 are exposed. Thus, the lower contact plug layer may be divided into a plurality of lower contact plugs 460 spaced apart from each other by the second capping patterns 450 between the bit line structures 395.

Figure 20:
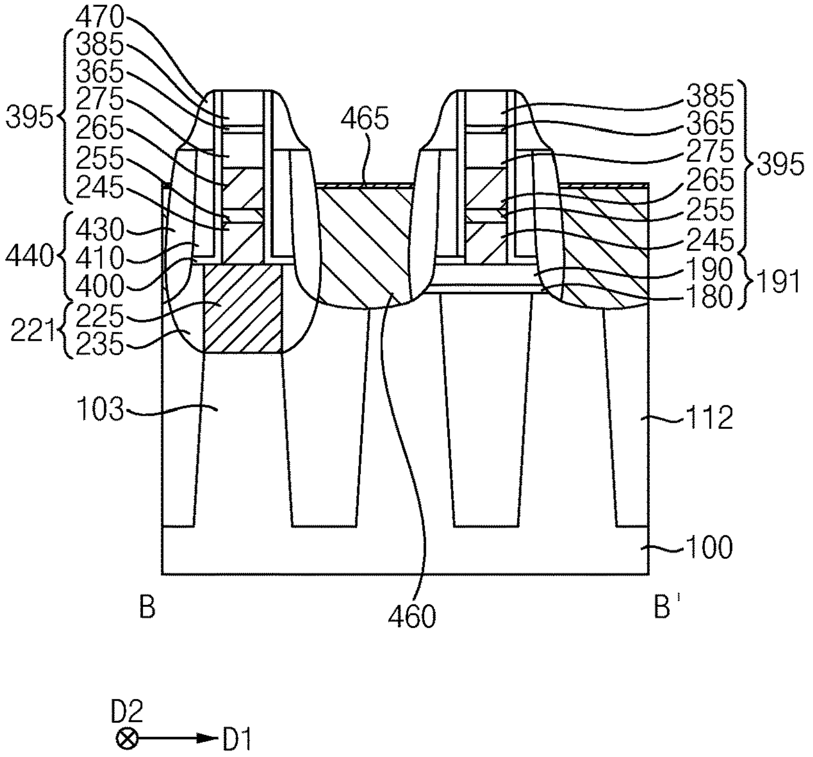

Referring to FIG. 20, an upper portion of the lower contact plug 460 may be removed to expose an upper portion of the preliminary spacer structure 440 on the sidewall of the bit line structure 395, and upper portions of the second and third spacers 410 and 430 of the preliminary spacer structure 440 may be removed.

The upper portion of the lower contact plug 460 may be removed by, for example, an etch back process, and the upper portions of the second and third spacers 410 and 430 may be removed by, for example, a wet etching process.

A fourth spacer layer may be formed on the bit line structure 395, the preliminary spacer structure 440, the lower contact plug 460 and the second capping pattern 450, and may be anisotropically etched to form a fourth spacer 470 on an outer sidewall of a portion of the first spacer 400 on an upper sidewall of the bit line structure 395.

The fourth spacer 470 may cover upper surfaces of the second spacer 410 and the third spacer 430.

An upper portion of the lower contact plug 460 may be further removed such that an upper surface of the lower contact plug 460 may be lower than upper surfaces of the second spacer 410 and the third spacer 430.

An ohmic contact pattern 465 may be formed on the upper surface of the lower contact plug 460. In example embodiments, the ohmic contact pattern 465 may be formed by forming a first metal layer on the bit line structure 395, the first spacer 400, the fourth spacer 470, the lower contact plug 460 and the second capping pattern 450, and performing a heat treatment on the first metal layer such that the first metal layer and silicon of the lower contact plug 460 may be reacted with each other. An unreacted portion of the first metal layer may be removed.

Figure 21:
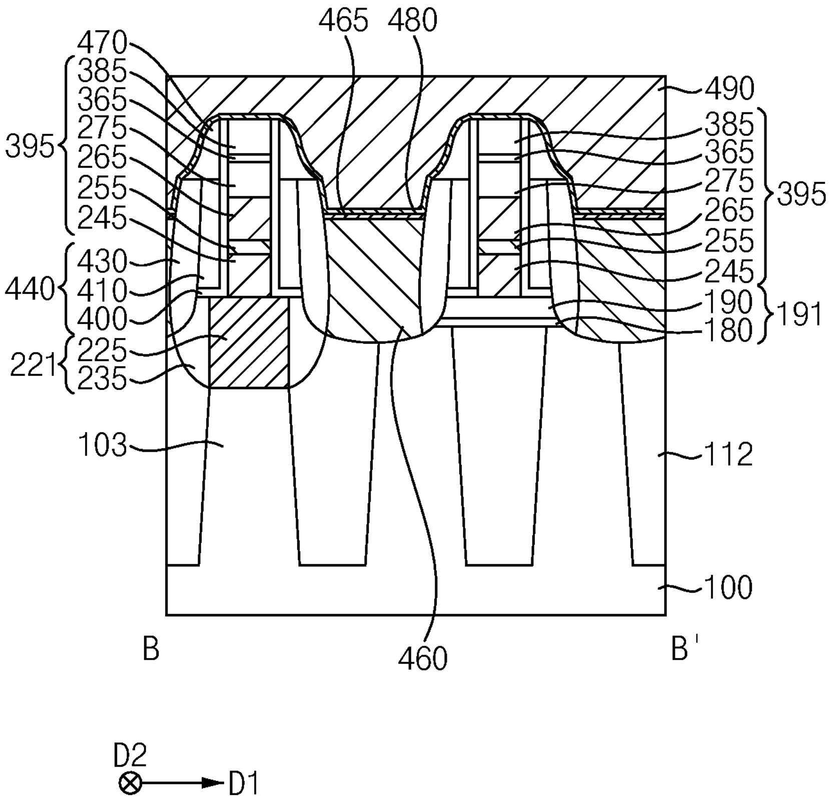

Referring to FIG. 21, a third barrier layer 480 may be formed on the bit line structure 395, the first spacer 400, the fourth spacer 470, the ohmic contact pattern 465 and the second capping pattern 450. The second metal layer 490 may be formed on the third barrier layer 480 to fill a space between the bit line structures 395.

A planarization process may be further performed on the second metal layer 490. The planarization process may include a CMP process and/or an etch back process.

Figure 22:
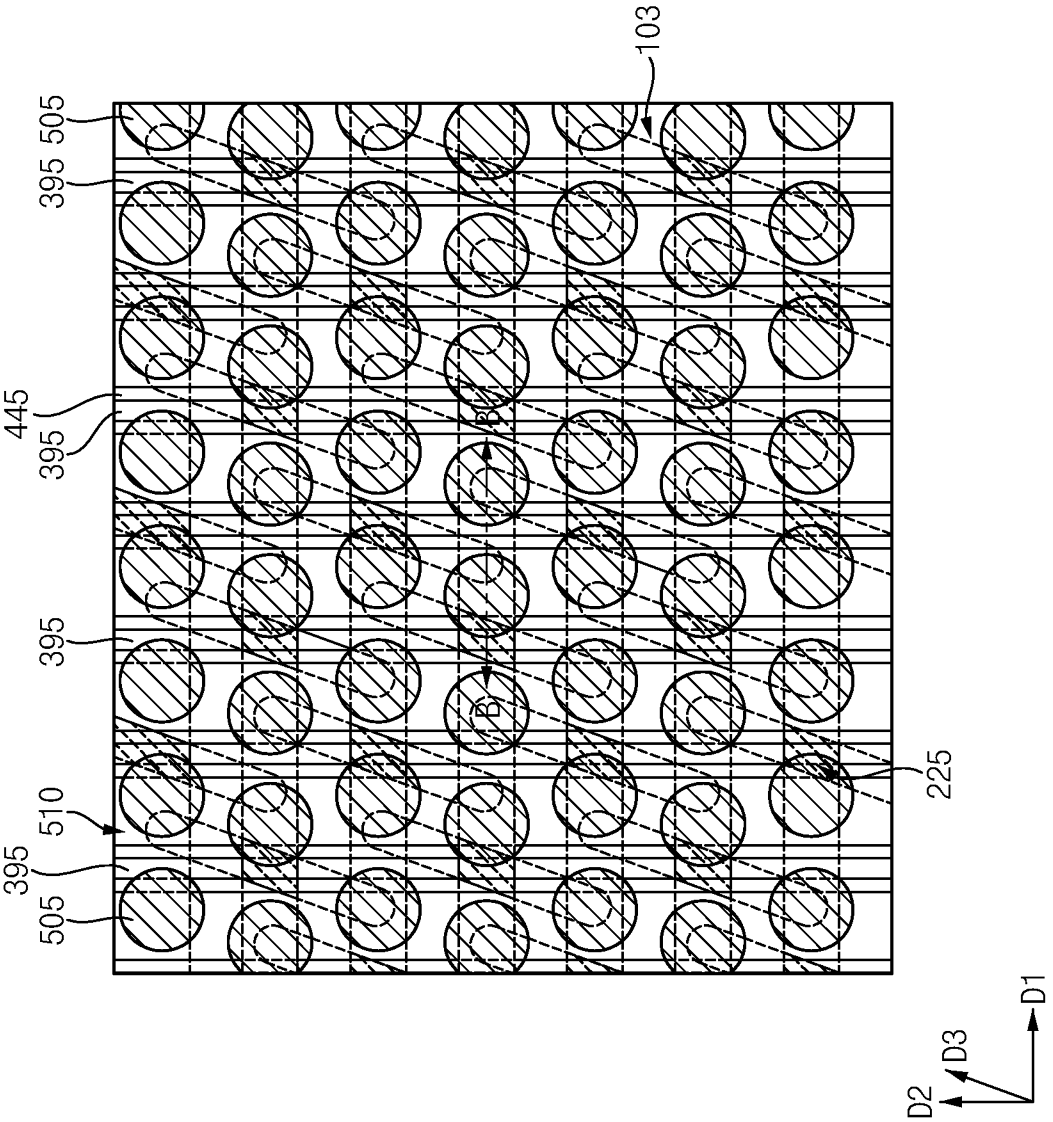
Figure 23:
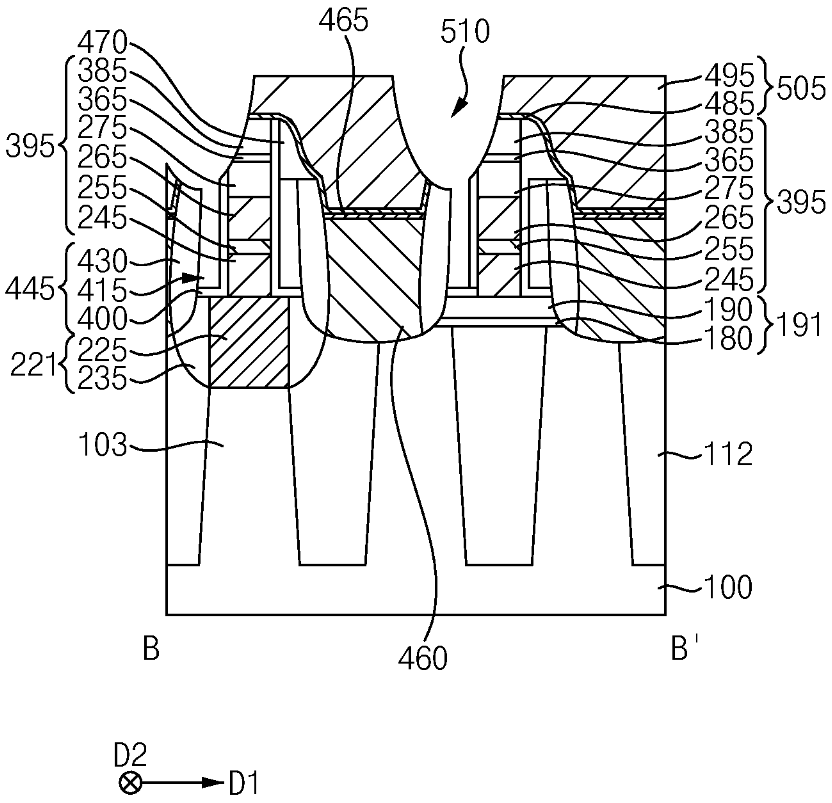

Referring to FIGS. 22 and 23, the second metal layer 490 and the third barrier layer 480 may be patterned to form an upper contact plug 505, and a sixth opening 510 may be formed between a plurality of upper contact plugs 505.

During the formation of the sixth opening 510, not only the second metal layer 490 and the third barrier layer 480 but also an upper portion of the insulation structure 366 included in the bit line structure 395, the preliminary spacer structure 440 and the fourth spacer 470 on the sidewall thereof, and the second capping pattern 450 may also be partially removed, and thus an upper surface of the second spacer 410 may be exposed.

As the sixth opening 510 is formed, the second metal layer 490 and the third barrier layer 480 may be transformed, respectively, into a second metal pattern 495 and a third barrier pattern 485 covering a lower surface and a sidewall of the second metal pattern 495, which may form the upper contact plug 505. In example embodiments, the plurality of upper contact plugs 505 may be spaced apart from each other in the first and second directions D1 and D2, and may be arranged in a honeycomb pattern or a lattice pattern in a plan view. Each of the upper contact plugs 505 may have a shape of a circle, an ellipse, or a polygon in a plan view.

The lower contact plug 460, the ohmic contact pattern 465 and the upper contact plug 505 sequentially stacked on the substrate 100 may collectively form a contact plug structure.

The second spacer 410 may be removed to form an air gap 415 connected to the sixth opening 510. The second spacer 410 may be removed by, for example, a wet etching process.

In example embodiments, a first portion of the second spacer 410 on the sidewall of the bit line structure 395 extending in the second direction D2, which are directly exposed by the sixth opening 510, and a second portion of the second spacer 410 that is parallel to the first portion in the horizontal direction may be removed. That is, the portion of the second spacer 410 exposed by the sixth opening 510 not to be covered by the upper contact plug 505 and a portion of the second spacer 410 covered by the upper contact plug 505 may be removed.

Referring to FIGS. 1 and 2, a third insulation pattern 520 may be formed on an inner wall of the sixth opening 510, and a fourth insulation pattern 530 may be formed on the third insulation pattern 520 to fill a remaining portion of the sixth opening 510. Thus, a top end of the air gap 415 may be closed by the third insulation pattern 520.

The air gap 415 may also be referred to as an air spacer 415, and the first spacer 400, the air spacer 415 and the third spacer 430 may collectively form a spacer structure 445.

A second etch stop layer 540 may be formed on the third and fourth insulation patterns 520 and 530, the upper contact plug 505 and the second capping pattern 450, and a mold layer may be formed on the second etch stop layer 540. A portion of the mold layer and a portion of the second etch stop layer 540 thereunder may be removed to form a seventh opening exposing an upper surface of the upper contact plug 505.

As the upper contact plugs 505 are arranged in a honeycomb pattern or a lattice pattern in a plan view, the sixth openings exposing the upper contact plugs 505, respectively, may also be arranged in the honeycomb pattern or the lattice pattern in a plan view.

A lower electrode layer may be formed on the upper surface of the upper contact plug 505 exposed by the sixth opening, a sidewall of the sixth opening and an upper surface of the mold layer, a second sacrificial layer may be formed on the lower electrode layer to fill a remaining portion of the sixth opening, and the second sacrificial layer and the lower electrode layer may be planarized until the upper surface of the mold layer is exposed so that the lower electrode layer may be divided into a plurality of pieces.

Accordingly, a lower electrode 550 may be formed to have a shape of a cylinder in the seventh opening. However, if the seventh opening has a small width, the lower electrode 550 may have a shape of a pillar.

The second sacrificial layer and the mold layer may be removed by a wet etching process using, for example, a limulus amebocyte lysate (LAL) solution as an etching solution.

A dielectric layer 560 may be formed on a surface of the lower electrode 550 and an upper surface of the second etch stop layer 540.

An upper electrode 570 may be formed on the dielectric layer 560. In an example embodiment, the upper electrode 570 may include a first upper electrode containing a metal or a metal nitride and a second upper electrode containing doped silicon-germanium.

The lower electrode 550, the dielectric layer 560 and the upper electrode 570 may collectively form a capacitor 580.

Upper wirings may be further formed on the capacitor 580, such that the fabrication of the semiconductor device may be completed.

As illustrated above, after forming the conductive filling pattern 225 on the upper surface of the active pattern 103 exposed by the first opening 200 through the selective deposition process, the insulating filling pattern 235 may be formed to fill a remaining portion of the first opening 200, and thus the conductive filling pattern 225 may be formed only on the upper surface of the active pattern 103 and may not be formed on the upper surface of the isolation pattern 112 adjacent thereto. Particularly, the first inhibitor 210 may be used or the ALE process may be performed, so that the conductive filling pattern 225 may be formed only on the upper surface of the active pattern 103.

Thus, electric short or leakage current, which may occur if the conductive filling pattern 225 is also formed on the upper surface of the isolation pattern 112, may be reduced.

For example, if a layer structure is deposited on the active pattern 103, the isolation pattern 112 and the insulation pattern structure 191 on which the first opening 200 is formed, and patterned to form the bit line structure 395, the layer structure in a lower portion of the first opening 200 may not be well patterned, such that a portion of the layer structure in an edge portion of the first opening 200 may remain, which may cause an electric short a leakage current.

However, in example embodiments, the conductive filling pattern 225 may be formed only on the upper surface of the active pattern 103 exposed by the first opening 200 through the selective deposition process, and the insulating filling pattern 235 may be formed to fill a remaining portion of the first opening 200, such that the electric short or leakage current due to the conductive filling pattern 225 may be reduced even if the first opening 200 has a small size.

Figure 24:
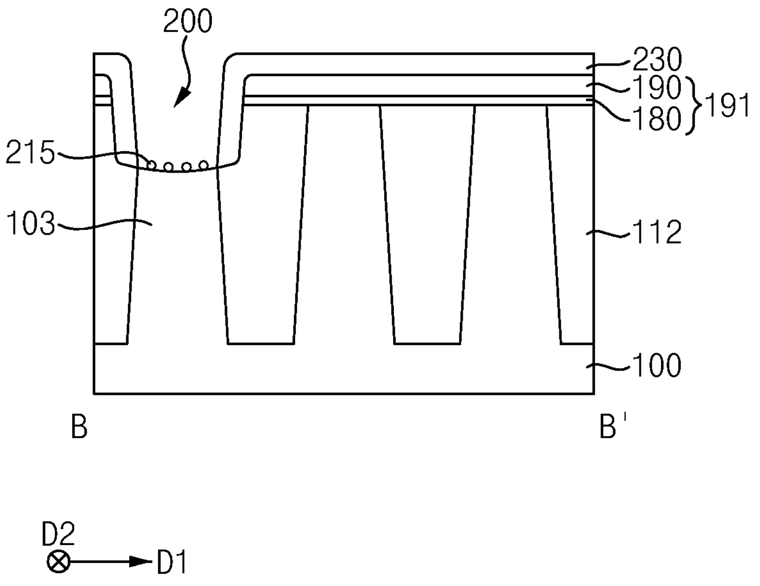
FIGS. 24, 25 and 26 are cross-sectional views illustrating a method of manufacturing a semiconductor device according to example embodiments.
Figure 25:
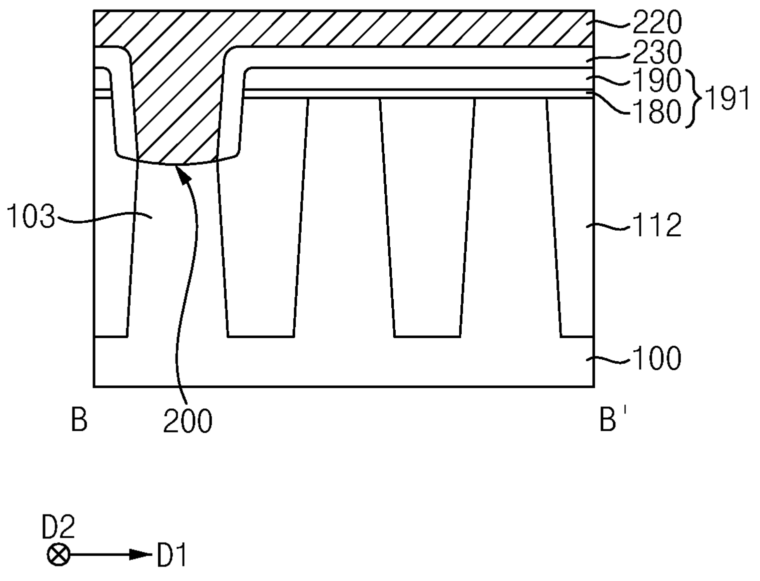
Figure 26:
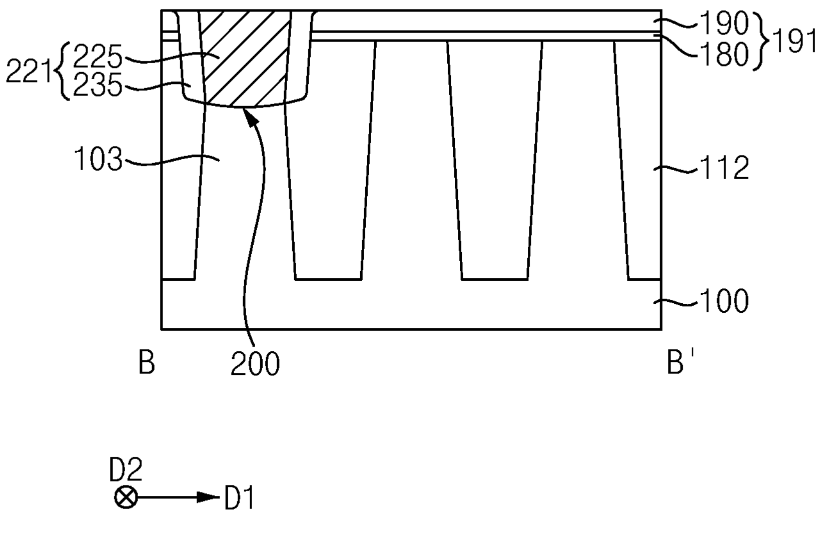

FIGS. 24, 25 and 26 are cross-sectional views illustrating a method of manufacturing a semiconductor device according to example embodiments.

The method depicted in FIGS. 24-26 may include processes substantially the same as or similar to those illustrated with reference to FIGS. 3 to 23 and FIGS. 1 and 2, and thus repeated explanations thereof may be omitted.

Referring to FIG. 24, the insulating filling layer 230 may be formed on the insulation pattern structure 191 and the isolation pattern 112.

In example embodiments, the insulating filling layer 230 may be formed by an atomic layer deposition (ALD) process, and may be selectively deposited on surfaces of the insulation pattern structure 191 and the isolation pattern 112, which may include an insulating material. The insulating filling layer 230 may include a metal oxide (e.g., aluminum oxide, zinc oxide, titanium oxide, hafnium oxide, indium oxide, etc.).

In an example embodiment, before or during the selective deposition process, a second inhibitor 215 may be coated on the active pattern 103 including silicon, and thus the insulating filling layer 230 may be formed only on the surfaces of the insulation pattern structure 191 and the isolation pattern 112. The second inhibitor 215 may include, for example, Hacac (acetyacetone), octadecyltrichlorosilane (ODTS), 1-octadecene, tris(dimethylamino)silane (3DMAS), methoxytrimethylsilane (MOTMS), hexafluoroacetylacetone (Hfhac), etc.

Alternatively, during the selective deposition process, a nucleation delay may be used, or an ALE process may also be performed, such that the insulating filling pattern 230 may not be formed on the active pattern 103.

For example, if the insulating filling layer 230 includes aluminum oxide, the insulating filling layer 230 may be formed on the surfaces of the insulation pattern structure 191 and the isolation pattern 112 by an ALD process using, for example, trimethylaluminium (TMA) and $H_2O$ as a precursor and a reactant, respectively, and an ALE process may also be performed using, for example, dimethylaluminum chloride (DMAC) and hafnium (Hf) as a precursor and a reactant, respectively, such that the insulating filling layer 230 may not be formed on the surface of the active pattern 103.

If the insulating filling layer 230 includes zinc oxide, the insulating filling layer 230 may be formed on the surfaces of the insulation pattern structure 191 and the isolation pattern 112 by an ALD process using, for example, diethylzinc (DEZ) and $H_2O$ as a precursor and a reactant, respectively, and an ALE process may also be performed using, for example, Hacac and O2 plasma or TMA and HF as a precursor and a reactant, respectively, such that the insulating filling layer 230 may not be formed on the surface of the active pattern 103.

If the insulating filling layer 230 includes titanium oxide, the insulating filling layer 230 may be formed on the surfaces of the insulation pattern structure 191 and the isolation pattern 112 by an ALD process using, for example, $TiCl_4$ and $H_2O$ as a precursor and a reactant, respectively, and an ALE process may also be performed using, for example, $WF_6$ and $BCl_3$ as a precursor and a reactant, respectively, such that the insulating filling layer 230 may not be formed on the surface of the active pattern 103.

If the insulating filling layer 230 includes hafnium oxide, the insulating filling layer 230 may be formed on the surfaces of the insulation pattern structure 191 and the isolation pattern 112 by an ALD process using, for example, TDEAHf (TEMAHf or $HfCl_4$) and $H_2O$ as a precursor and a reactant, respectively, and an ALE process may also be performed using, for example, DMAC and HF as a precursor and a reactant, respectively, such that that the insulating filling layer 230 may not be formed on the surface of the active pattern 103.

Referring to FIG. 25, if the second inhibitor 215 is coated, the second inhibitor 215 may be removed, and the conductive filling layer 220 may be formed on the active pattern 103 and the insulating filling layer 230 to fill the first opening 200.

The conductive filling layer 220 may be formed by, for example, a CVD process or an ALD process.

Referring to FIG. 26, upper portions of the conductive filling layer 220 and the insulating filling layer 230 may be planarized until the upper surface of the insulation pattern structure 191 is exposed, so that the filling structure 221 including the conductive filling pattern 225 and the insulating filling pattern 235 may be formed in the first opening 200.

Processes substantially the same as or similar to those illustrated with reference to FIGS. 12 to 23 and FIGS. 1 and 2 may be performed to complete the fabrication of the semiconductor device.

As illustrated above, the insulating filling layer 230 may be formed on the upper surfaces of the isolation pattern 112 and the insulation pattern structure 191 exposed by the first opening 200, the conductive filling layer 220 may be formed on the insulating filling layer 230 to fill a remaining portion of the first opening 200, and the conductive filling layer 220 and the insulating filling layer 230 may be planarized to form the conductive filling pattern 225 and the insulating filling pattern 235, respectively. Thus, the conductive filling pattern 225 may be formed only on the active pattern 103, and may not be formed on the upper surface of the isolation pattern 112 adjacent thereto. Particularly, the second inhibitor 215 may be used or the ALE process may also be performed, such that the conductive filling pattern 225 may be formed only on the upper surface of the active pattern 103.

Accordingly, the electric short or leakage current due to the conductive filling pattern 225 may be reduced even if the first opening 200 has a small size.

Figure 27:
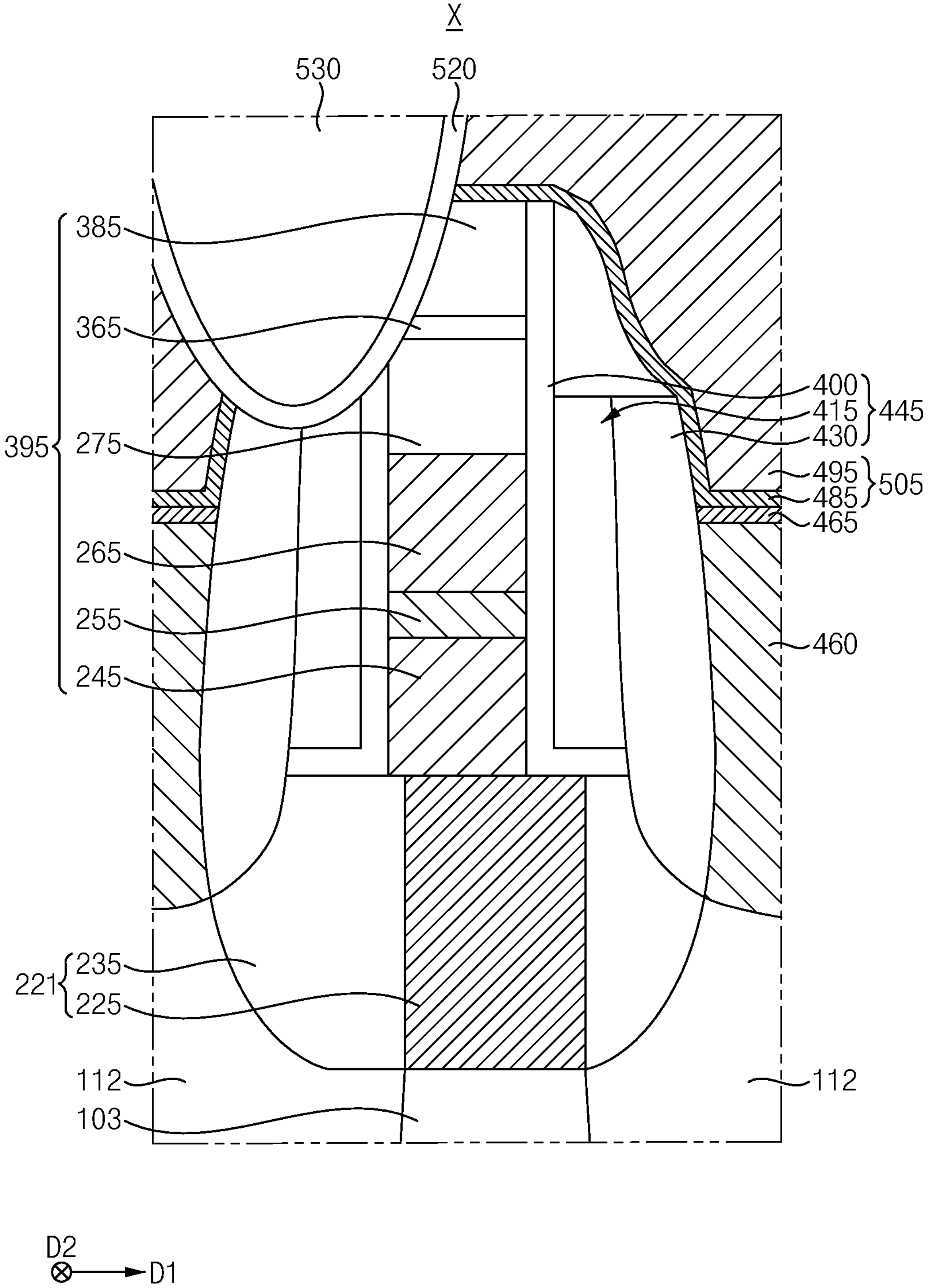
FIGS. 27, 28 and 29 are diagrams illustrating semiconductor devices according to example embodiments.
Figure 28:
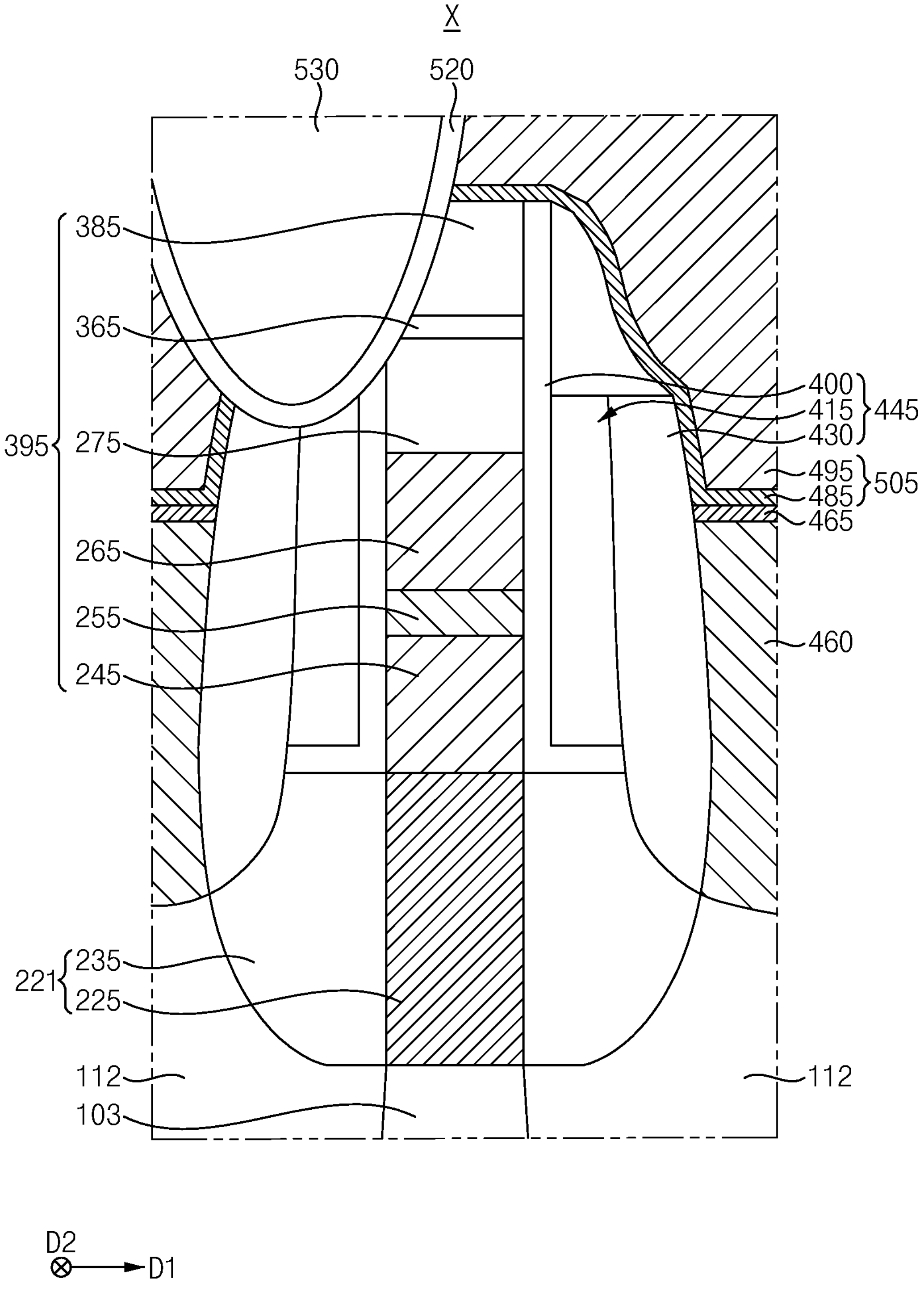
Figure 29:
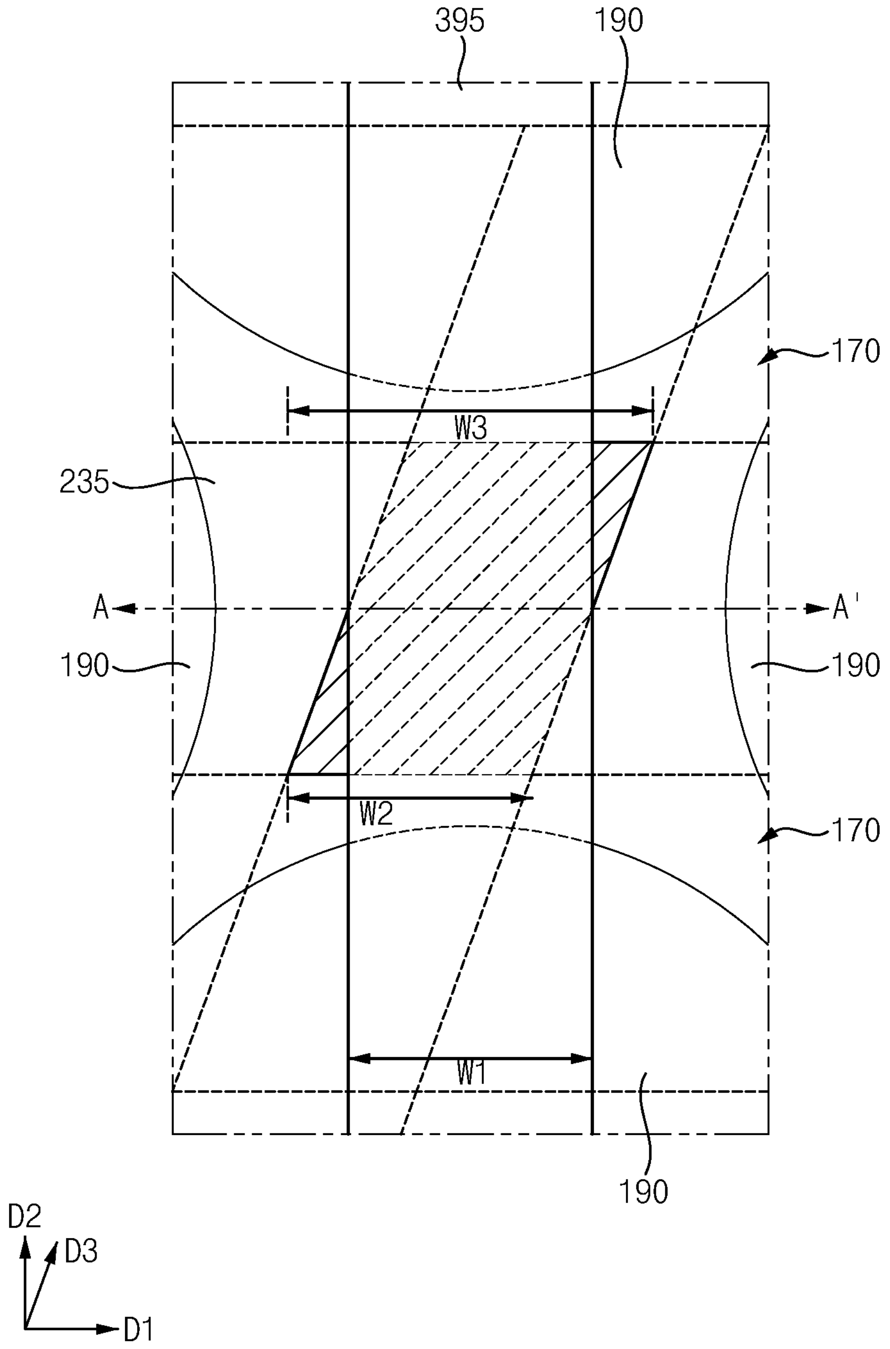

FIGS. 27, 28 and 29 are diagrams illustrating semiconductor devices according to example embodiments. Particularly, FIGS. 27 and 28 are enlarged cross-sectional views of region X of FIG. 2, and FIG. 29 is an enlarged plan view corresponding to FIG. 14.

The semiconductor devices depicted in FIGS. 27-29 may be substantially the same as or similar to that of FIGS. 1 and 2, except for the relation between the conductive filling pattern 225 and the bit line structure 395, and thus repeated explanations may be omitted.

Referring to FIG. 27, the bit line structure 395 may also be formed on an upper surface of a portion of the insulating filling pattern 235 adjacent to the conductive filling pattern 225 in the first direction D1, due to misalignment of the bit line structure 395 on the conductive filling pattern 225.

That is, the conductive filling pattern 225 may not be formed during the patterning process for forming the bit line structure 395, but may be formed by an independent process before the patterning process, and thus, if the misalignment occurs during the patterning process, the bit line structure 395 may not be formed only on the upper surface of the conductive filling pattern 225, but may also be formed on the upper surface of the portion of the insulating filling pattern 235 adjacent to the conductive filling pattern 225.

However, if only the bit line structure 395 and the conductive filling pattern 225 contact, the bit line structure 395 may be electrically connected to the active pattern 103 through the conductive filling pattern 225. Additionally, the conductive filling pattern 225 may be still covered by the insulating filling pattern 235, the electric short or leakage current may be reduced.

Referring to FIGS. 28 and 29, the first width W1 in the first direction D1 of the bit line structure 395 may be substantially equal to the second width W2 in the first direction D1 of the conductive filling pattern 225.

However, each of the lower and upper surfaces of the conductive filling pattern 225 may have a shape of a parallelogram, a portion of the upper surface of the conductive filling pattern 225 may not be covered by the bit line structure 395.

The disclosure may not be limited to the above, the first width W1 in the first direction D1 of the bit line structure 395 may be greater than the second width W2 in the first direction D1 of the conductive filling pattern 225. Even in this case, the first width W1 in the first direction D1 of the bit line structure 395 may be equal to or less than a third with W3, which may be a maximum width in the first direction D1 of the conductive filling pattern 225.

In the method of manufacturing a semiconductor device in accordance with example embodiments, a conductive filling pattern may be formed only on an upper surface of an active pattern by a selective deposition process, and an insulating filling pattern may be formed to cover a sidewall of the conductive filling pattern. Thus, electric short or leakage current due to the conductive filling pattern may decrease.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor device comprising:

a first active pattern on a substrate, the first active pattern extending in a third direction having an acute angle with respect to a first direction and a second direction, the first direction and the second direction being substantially parallel to an upper surface of the substrate and substantially perpendicular to each other;

a first conductive filling pattern on an upper surface of a central portion of the first active pattern, the first conductive filling pattern having a shape of a parallelogram;

a gate structure extending in the first direction in an upper portion of the first active pattern; and a bit line structure on the first conductive filling pattern and extending in the second direction.

2. The semiconductor device of claim 1, wherein a width of the bit line structure in the first direction is less than a width of the first conductive filling pattern in the first direction.

3. The semiconductor device of claim 1, wherein, in the first direction, a width of the bit line structure is less than or equal to a maximum width of the first conductive filling pattern.

4. The semiconductor device of claim 1, further comprising an insulating filling pattern on a sidewall of the first conductive filling pattern.

5. The semiconductor device of claim 4, wherein the insulating filling pattern comprises a metal oxide.

6. The semiconductor device of claim 4, wherein the insulating filling pattern comprises at least one of silicon oxide, silicon nitride, and a low-k dielectric material.

7. The semiconductor device of claim 4, further comprising:

a plurality of active patterns comprising the first active pattern, wherein the plurality of active patterns are spaced apart in the first direction and the second direction, and a plurality of conductive filling patterns comprising the first conductive filling pattern, wherein the plurality of conductive filling patterns are spaced apart in the first direction and the second direction, and wherein the insulating filling pattern contacts sidewalls of the plurality of conductive filling patterns.

8. The semiconductor device of claim 7, wherein each of the plurality of conductive filling patterns comprises:

first sidewalls opposite each other in a fourth direction; and second sidewalls opposite each other in the second direction, wherein the fourth direction is substantially parallel to the upper surface of the substrate and substantially perpendicular to the third direction, and wherein the first sidewalls and the second sidewalls of each of the plurality of conductive filling patterns contact the insulating filling pattern.

9. The semiconductor device of claim 1, wherein the first active pattern comprises a first edge portion and a second edge portion opposite the first edge portion, and wherein the semiconductor device further comprises:

a contact plug structure contacting an upper surface of each of the first edge portion and the second edge portion of the first active pattern; and a capacitor on the contact plug structure.

10. The semiconductor device of claim 1, further comprising a spacer structure comprising a first spacer, a second spacer and a third spacer sequentially stacked in the first direction and on a sidewall of the bit line structure, wherein the second spacer comprises an air spacer.

11. A semiconductor device comprising:

active patterns on a substrate and spaced apart in a first direction and a second direction, the first direction and the second direction being substantially parallel to an upper surface of the substrate and substantially perpendicular to each other, wherein each of the active patterns extends in a third direction having an acute angle with respect to the first direction and the second direction;

gate structures extending in the first direction in upper portions of the active patterns, the gate structures being spaced apart in the second direction;

conductive filling patterns on respective upper surfaces of central portions of the active patterns;

an insulating filling pattern on the substrate, the insulating filling pattern contacting sidewalls of the conductive filling patterns; and bit line structures on the conductive filling patterns and the insulating filling pattern, wherein each of the bit line structures extends in the second direction and the bit line structures are spaced apart in the first direction.

12. The semiconductor device of claim 11, wherein each of the conductive filling patterns comprises a portion having an upper surface, and wherein the upper surface of the portion of each of the conductive filling patterns does not contact the bit line structures.

13. The semiconductor device of claim 11, wherein the bit line structures respectively correspond to the conductive filling patterns, and wherein, in the first direction, a width of each of the bit line structures is less than or equal to a maximum width of a respective conductive filling pattern.

14. The semiconductor device of claim 11, wherein the insulating filling pattern comprises a metal oxide.

15. The semiconductor device of claim 11, wherein each of the conductive filling patterns comprises:

first sidewalls opposite each other in a fourth direction, and second sidewalls opposite each other in the second direction, wherein the fourth direction is substantially parallel to the upper surface of the substrate and substantially perpendicular to the third direction, and wherein the first sidewalls and the second sidewalls of each of the conductive filling patterns contact a sidewall of the insulating filling pattern.

16. The semiconductor device of claim 11, wherein each of the active patterns comprises opposite edge portions, and wherein the semiconductor device further comprises:

a contact plug structure contacting an upper surface of each opposite edge portion of each of the active patterns; and a capacitor on the contact plug structure.

17. A semiconductor device comprising:

active patterns on a substrate and spaced apart in a first direction and a second direction that are substantially parallel to an upper surface of the substrate and substantially perpendicular to each other, wherein each of the active patterns extend in a third direction having an acute angle with respect to the first direction and the second direction;

an isolation pattern on the substrate, the isolation pattern provided on sidewalls of the active patterns;

gate structures each extending in the first direction in upper portions of the active patterns and in the isolation pattern, the gate structures being spaced apart in the second direction;

conductive filling patterns on respective upper surfaces of central portions of the active patterns, wherein each of the conductive filling patterns comprises an upper surface having a parallelogram shape;

an insulating filling pattern on the isolation pattern, the insulating filling pattern contacting sidewalls of the conductive filling patterns;

bit line structures on the conductive filling patterns and the insulating filling pattern, wherein each of the bit line structures extends in the second direction, and the bit line structures are spaced apart in the first direction;

a spacer structure on a sidewall of each of the bit line structures;

contact plug structures contacting respective upper surfaces of opposite edge portions of the active patterns; and at least one capacitor on each of the contact plug structures.

18. The semiconductor device of claim 17, wherein the insulating filling pattern comprises a metal oxide.

19. The semiconductor device of claim 17, wherein the insulating filling pattern contacts an upper surface of each of the gate structures.

20. The semiconductor device of claim 17 wherein each of the conductive filling patterns comprises:

first sidewalls opposite each other in a fourth direction, and second sidewalls opposite each other in the second direction, wherein the fourth direction is substantially parallel to the upper surface of the substrate and substantially perpendicular to the third direction, and wherein the first sidewalls and the second sidewalls of each of the conductive filling patterns contact a sidewall of the insulating filling pattern.

* * * * *